US006875282B2

(12) United States Patent
Tanaka et al.

(10) Patent No.: US 6,875,282 B2
(45) Date of Patent: Apr. 5, 2005

(54) SUBSTRATE TRANSPORT CONTAINER

(75) Inventors: Akira Tanaka, Tokyo (JP); Yoko Suzuki, Tokyo (JP); Takashi Kishi, Tokyo (JP)

(73) Assignee: Ebara Corporation, Tokyo (JP)

( * ) Notice: Subject to any disclaimer, the term of this patent is extended or adjusted under 35 U.S.C. 154(b) by 292 days.

(21) Appl. No.: 10/145,692

(22) Filed: May 16, 2002

(65) Prior Publication Data

US 2002/0135966 A1 Sep. 26, 2002

Related U.S. Application Data

(60) Provisional application No. 60/340,503, filed on Dec. 19, 2001.

(30) Foreign Application Priority Data

May 17, 2001 (JP) ........................................ 2001-148526

(51) Int. Cl.[7] .............................................. C23C 16/00
(52) U.S. Cl. ........................ 118/719; 414/935; 414/940; 156/345.31
(58) Field of Search ....................... 118/719; 156/345.31, 156/345.32; 414/937, 938, 940; 206/710–712, 832–833

(56) References Cited

U.S. PATENT DOCUMENTS

| 4,724,874 | A |   | 2/1988  | Parikh et al.              |
|-----------|---|---|---------|----------------------------|
| 4,770,680 | A |   | 9/1988  | Machida et al.             |
| 5,248,033 | A | * | 9/1993  | Kos et al. ........... 206/711 |
| 5,346,518 | A |   | 9/1994  | Baseman et al.             |
| 5,664,679 | A | * | 9/1997  | Schneider et al. ...... 206/711 |
| 5,709,065 | A | * | 1/1998  | Krause ................ 53/400 |
| 5,785,186 | A |   | 7/1998  | Babbs et al.               |
| 5,833,726 | A |   | 11/1998 | Kinkead et al.             |
| 5,843,196 | A | * | 12/1998 | Leavey et al. .......... 55/356 |
| 5,873,468 | A | * | 2/1999  | Ejima et al. ........... 206/711 |

(Continued)

FOREIGN PATENT DOCUMENTS

| EP | 0420122 A1 | 4/1991 |
| EP | 1067061 A1 | 1/2001 |
| EP | 1067583 A2 | 1/2001 |
| JP | 63-32950   | 2/1988 |
| JP | 2-96348    | 4/1990 |

(Continued)

OTHER PUBLICATIONS

Akira Tanaka et al., "Cleanbox", U.S. Appl. No. 09/555,798, filed Dec. 2, 1998.

(Continued)

Primary Examiner—Parviz Hassanzadeh
Assistant Examiner—Karla Moore
(74) Attorney, Agent, or Firm—Wenderoth, Lind & Ponack, L.L.P.

(57) ABSTRACT

A substrate transport container is used, for example, in the process of manufacturing integrated circuits of less than 0.13 μm line width, can hold the level of contaminants in the interior of the container for at least particles, acidic gases, basic gases, organic substances and humidity at controlled low levels, and has the size and structure to be compatible with automated semiconductor manufacturing plants. The container is provided with a door for loading and unloading substrates on a surface of a container main body and is constructed so as to hold the substrates inside the container main body at a given distance of separation. Air conditioning apparatuses for reducing the levels of particulate and gaseous contaminants are disposed roughly symmetrically on the container main body.

36 Claims, 21 Drawing Sheets

U.S. PATENT DOCUMENTS

| | | | | |
|---|---|---|---|---|
| 6,003,674 | A | * 12/1999 | Brooks | .................. 206/711 |
| 6,221,163 | B1 | 4/2001 | Roberson, Jr. et al. | |
| 6,364,922 | B1 | * 4/2002 | Tanaka et al. | ............. 55/385.1 |
| 2001/0027028 | A1 | * 10/2001 | Suzuki | .................. 438/762 |
| 2002/0124906 | A1 | * 9/2002 | Suzuki et al. | ................ 141/98 |
| 2003/0012625 | A1 | * 1/2003 | Rosenquist | ............ 414/217.1 |

FOREIGN PATENT DOCUMENTS

| | | | |
|---|---|---|---|
| JP | 6-318631 | 11/1994 | |
| JP | 7-283092 | 10/1995 | |
| JP | 8-148551 | 6/1996 | |
| JP | 10071319 A | * 3/1998 | ........... B01D/53/26 |
| JP | 2000-174109 | 6/2000 | |
| JP | 2001-077188 | 3/2001 | |

OTHER PUBLICATIONS

Yoko Suzuki et al., "Substrate Container and Method of Dehumidifying Substrate Container", U.S. Appl. No. 09/769,308, filed Jan. 26, 2001.

Akira Tanaka et al., "Power Supply Apparatus for Supplying Electric Power to Substrate Carrier Container", U.S. Appl. No. 09/987,383, filed Nov. 14, 2001.

Yoko Suzuki et al., "Substrate Transport Apparatus, Pod and Method", U.S. Appl. No. 10/000,304, filed Dec. 4, 2001.

* cited by examiner

F I G. 7
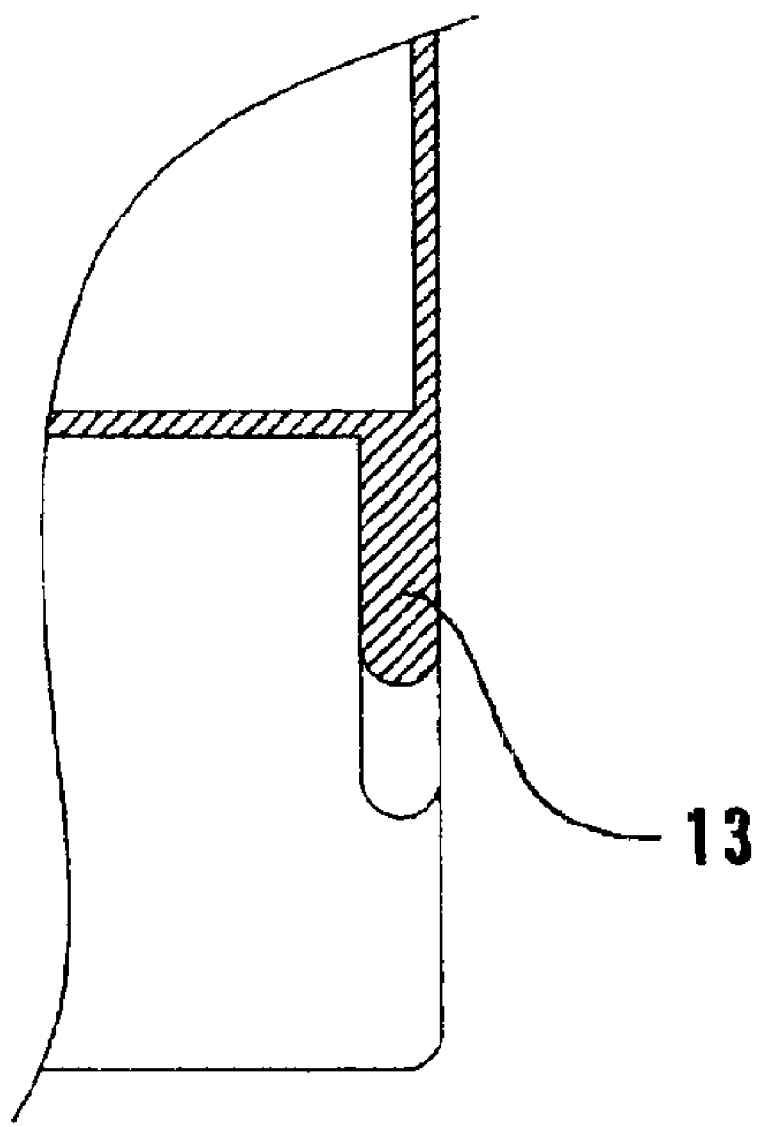

F I G. 16
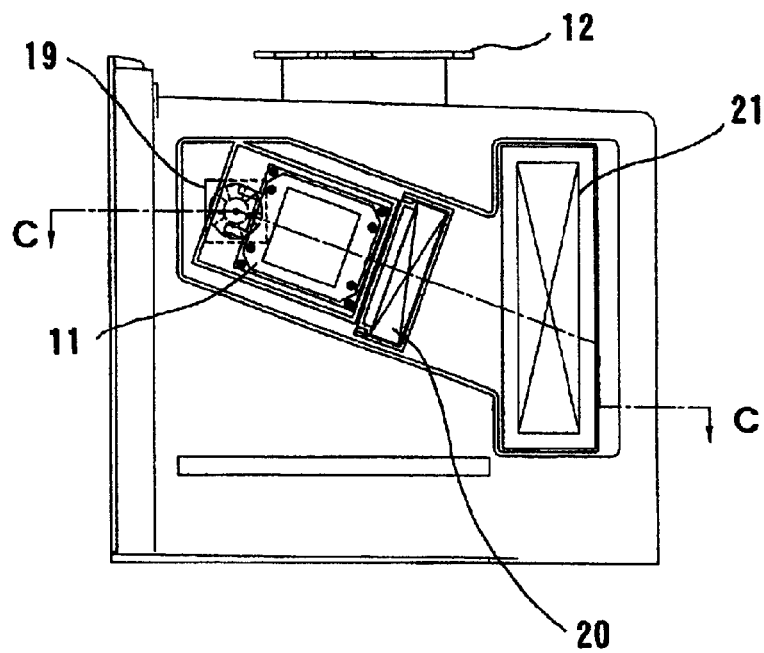
F I G. 17
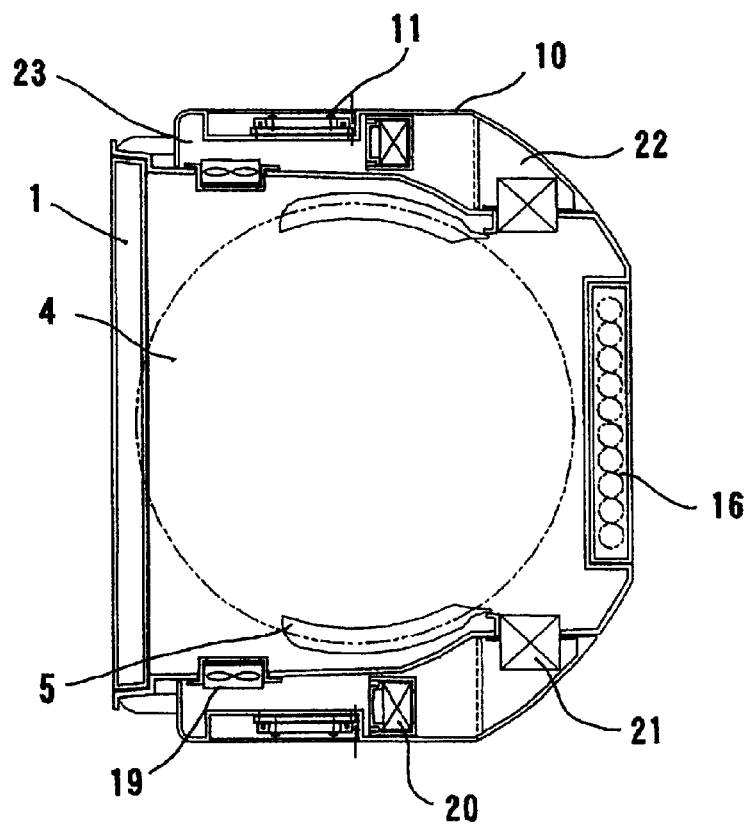

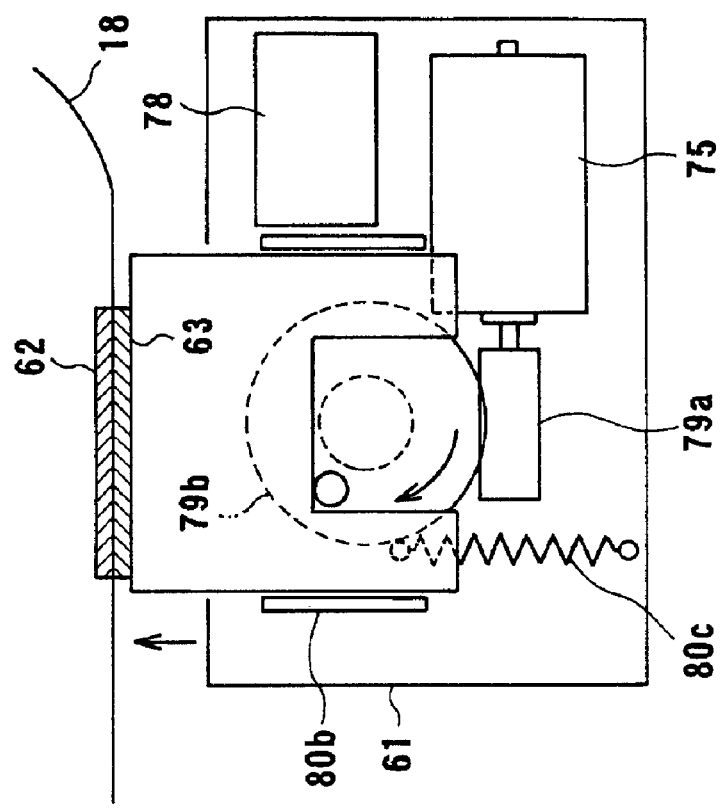
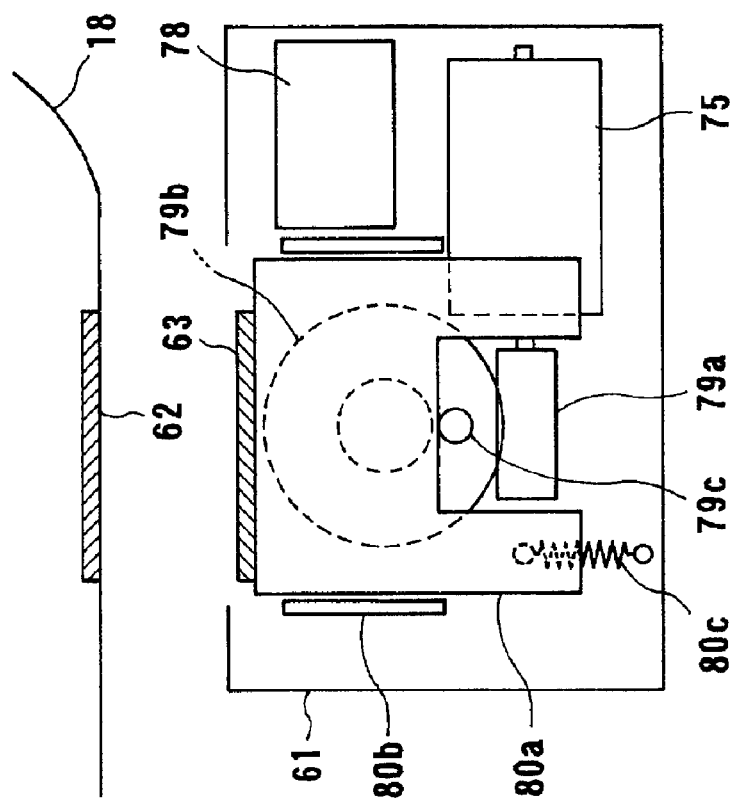

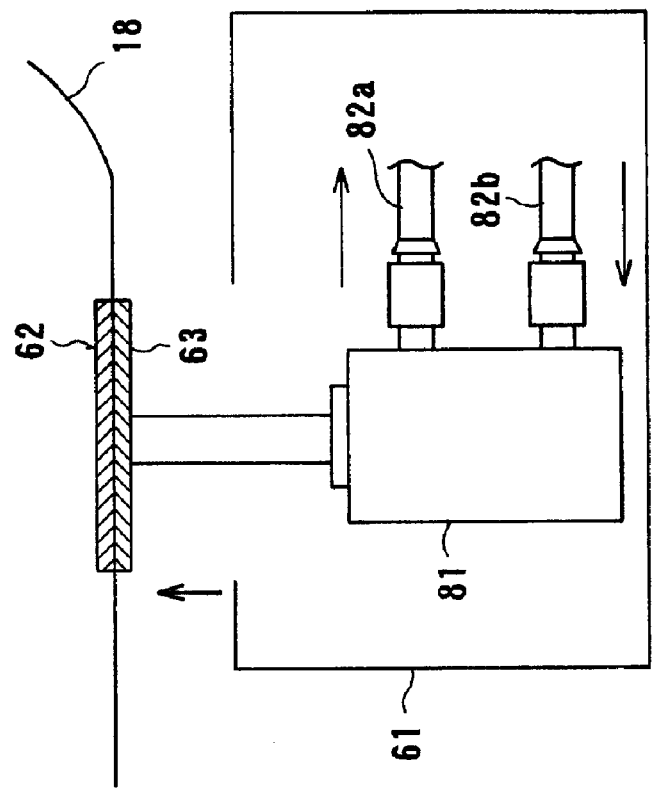
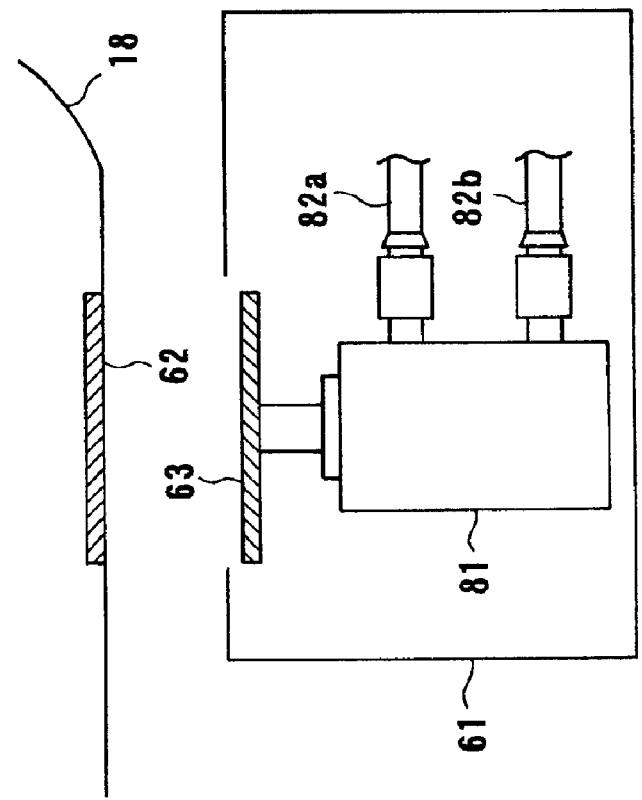

F I G. 27
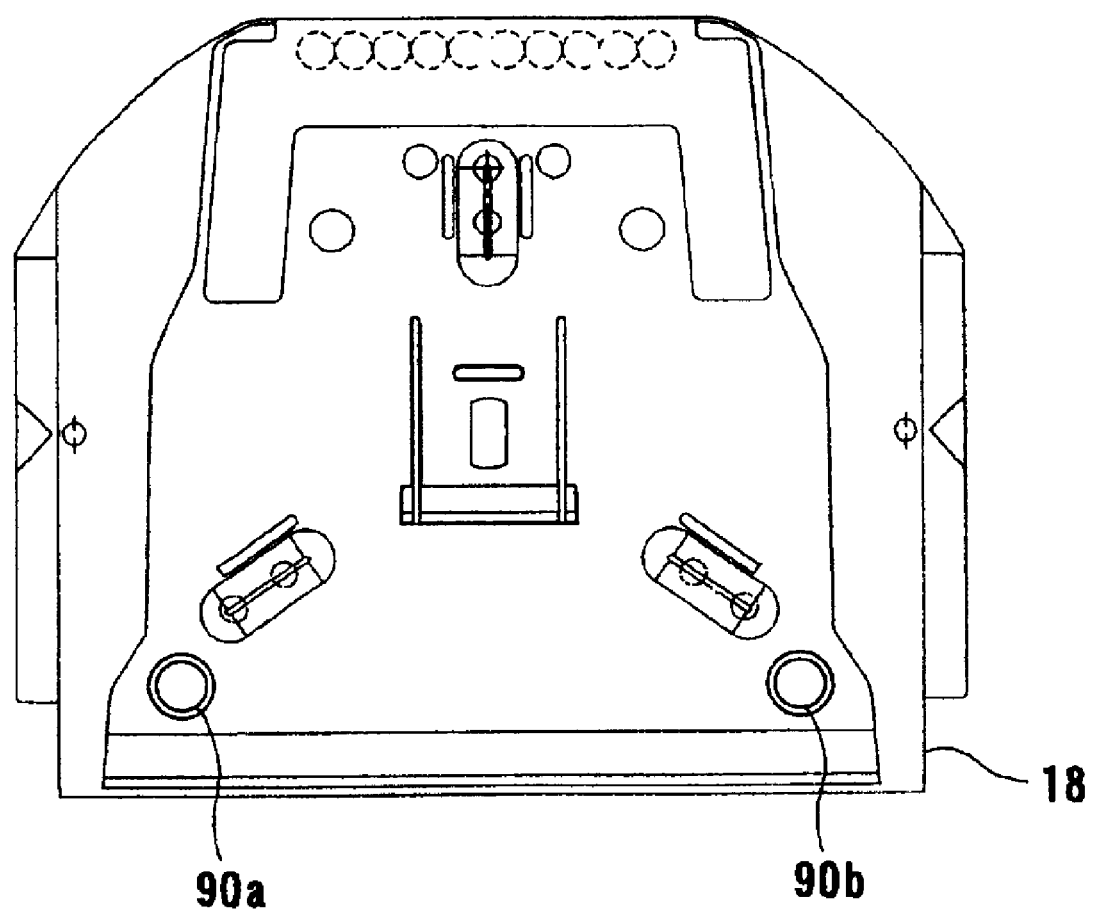

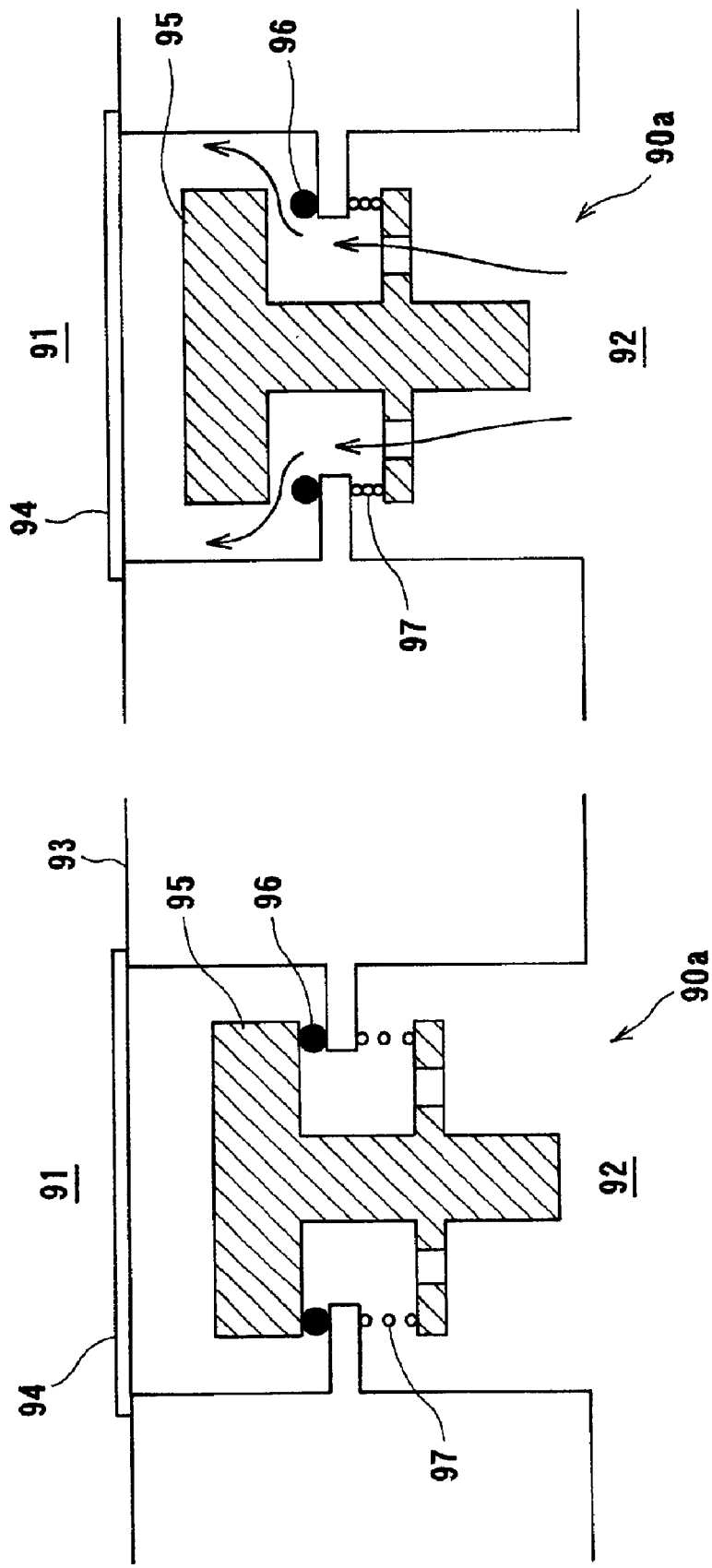

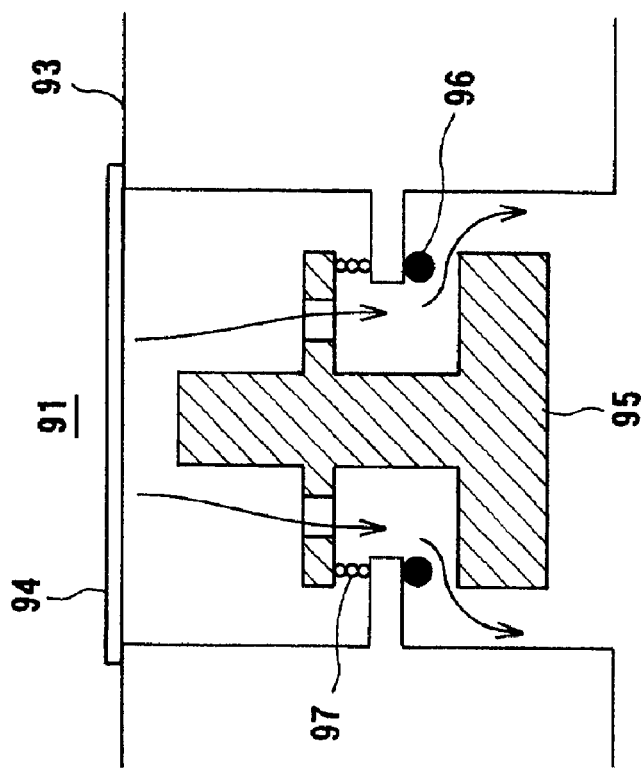
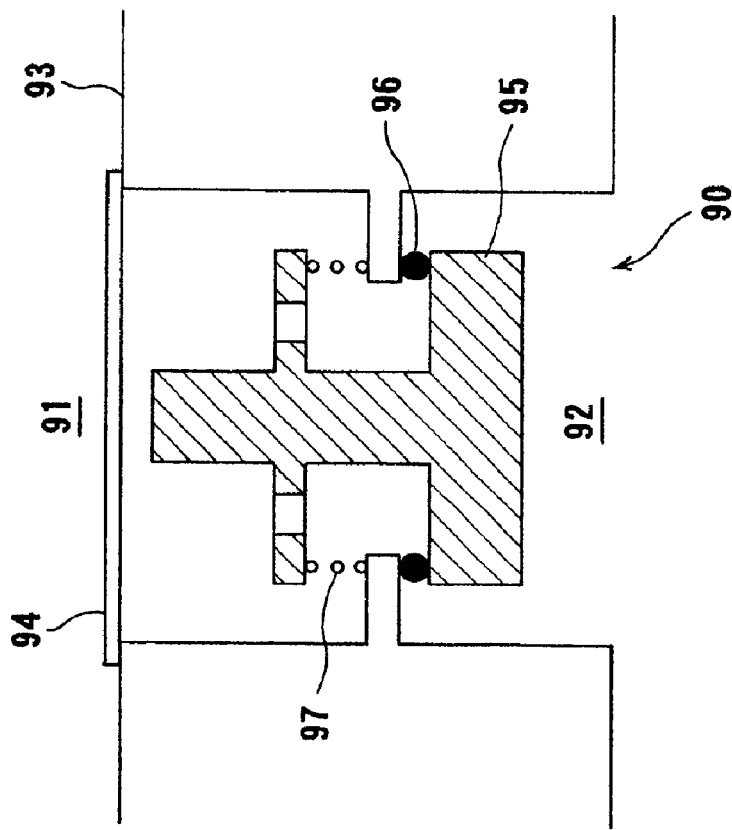

1

SUBSTRATE TRANSPORT CONTAINER

Applicants claim benefit of priority to prior U.S. patent application Ser. No. 60/340,503, filed Dec. 19, 2001.

BACKGROUND OF THE INVENTION

1. Field of the Invention

The present invention relates to the structures, capabilities and methods of operating a substrate transport container suitable for storing or transporting objects such as semiconductor wafers, photo-masks or hard-disks in a highly clean environment.

2. Description of the Related Art

As pattern sizes of semiconductor devices become finer, it is anticipated that even higher degree of cleanliness would be required in the future. For example, it is anticipated that the target control size of the particulate contaminants that can cause pattern defects and shorting of wiring would become smaller than 0.1 $\mu$m. Further, in addition to particulate contaminants, it becomes necessary to reduce gaseous contaminants. By adsorbing onto the semiconductor wafers, various hydrocarbon molecules cause deterioration in dielectric breakdown voltage of gate oxide film or thickness variations in deposited films. Base gases react with chemical enhancement type photoresist to result in loss of resolution and acidic gases can cause corrosion of wirings.

In addition, moisture (humidity) has been targeted for reduction in recent years. This is because finer patterning has led to the use of a variety of materials in forming wirings and films, and moisture in the environment can sometimes bind with the above-mentioned materials to cause problems. On the other hand, independent of the trend towards finer patterning, the size of the semiconductor wafers is increasing and automation is also progressing in the field of wafer-processing technologies. Automation of semiconductor manufacturing line is promoted by the fact that it is necessary to segregate humans, who act as a contamination source, and the fact that, as the diameter of the semiconductor wafers increases, the weight of the transport container increases to about 10 kg such that manual handling becomes difficult. Further, it becomes important to satisfy standardized conditions such as common structure and size of manufacturing equipment and transport apparatus as a necessary condition in the automated manufacturing line.

In the past, with increasing circuit density and speed of semiconductor chips, aluminum has been used as the material for wiring to connect elements within the semiconductor chip. However, when the width of the wires becomes less than 0.13 $\mu$m, conventional aluminum wiring causes serious problems of heat generation and signal delay so that, in place of aluminum wiring, there is a trend towards the use of copper wiring, which has lower resistivity than aluminum wiring.

Also, $SiO_2$ has been used as the insulation material for isolation of wiring. However, the dielectric constant of $SiO_2$, which is at about 4, is high, so that replacement of aluminum wiring with copper wiring only results in about 20% improvement in signal delay. There has thus been a need to use a substance of lower dielectric constant of less than 3 for the insulation material.

Prior to such a development, examination of copper wiring and low dielectric materials for insulation has already been carried out and identified a potential problem, arising from of the processing of chips with line-width at the level of 0.18 $\mu$m. Such low dielectric materials are based on organic materials or porous materials so that problems are encountered such as absorption of moisture from the environment, which leads to increasing dielectric constants, and therefore, these materials must be handled differently from conventional insulation films and are presenting an extremely difficult challenge.

Also, copper used for wiring behaves differently from aluminum that has been used in the past because of its tendency to react with oxygen in the air to produce oxide films. Also, because the copper molecules have higher chemical activity as compared with aluminum molecules such that, if particles containing copper or copper vapor itself is discharged into the cleanroom, the clean room is contaminates the cleanroom to lead to severe drop in the yield of semiconductor chips. Also, organic contaminants on silicon surface have been known to cause a drop in the reliability of gate oxide film, an increase in incubation time in the low pressure CVD processes and abnormal film growth. Therefore, even if a superior material is found in the future for use in making low dielectric insulation films, it is conceivable that it cannot be adopted because of its susceptibility to contamination from such impurities as organic substances and ions in the environment. Conversely, by controlling the processing environment, an opportunity may emerge of using those materials that have not been able to be used in the past. Also, if ammonia is present, the photo-resist material applied on the semiconductor wafer exhibits a so-called "T-top" phenomenon, which refers to a phenomenon that the top section of the developed photo-resist is wider than the bottom section.

SUMMARY OF THE INVENTION

This invention is provided in view of the background information described above, and an object of the present invention is to provide a substrate transport container for use in the process of manufacturing integrated circuits of less than 0.13 $\mu$m line width, to enable to freely control the environmental conditions such as concentration of contaminants in the interior of the container, at least, for particles, acidic gases, basic gases, organic substances and humidity, and having the size and structure to be compatible with automated semiconductor manufacturing plants.

To resolve the problems described above, there is provided a substrate transport container that satisfies the size specified by Semiconductor Equipment and Materials International (SEMI) standard, and is equipped with an air circulation device for exchanging the interior atmosphere of the container, means for capturing/adsorbing various types of contaminants, a dehumidifying device, and others so as to enable control of the interior environment of the container.

BRIEF DESCRIPTION OF THE DRAWINGS

FIG. 7 is a cross-sectional view through a plane C of the substrate transport container in FIG. 2;

FIG. 16 is a side view of the substrate transport container through a plane F—F in FIG. 14;

FIG. 17 is a cross sectional view of the substrate transport container through a plane G—G in FIG. 15;

FIGS. 24A and 24B are diagrams to show a movable power supplying mechanism based on a motor, a worm gear and a worm wheel;

FIGS. 25A and 25B are diagrams to show a movable power supplying mechanism based on a pneumatic drive;

FIG. 27 is a bottom view of the transport container in the fourth embodiment of the present invention;

FIG. 28A is a diagram to show a check valve of an air inlet port in a closed state, and FIG. 28B shows the valve in an open state;

FIG. 29A is a diagram to show as check valve of an air outlet port in a closed state, and FIG. 29B shows the valve in and open state;

DETAILED DESCRIPTION OF THE PREFERRED EMBODIMENTS

Figure 1:
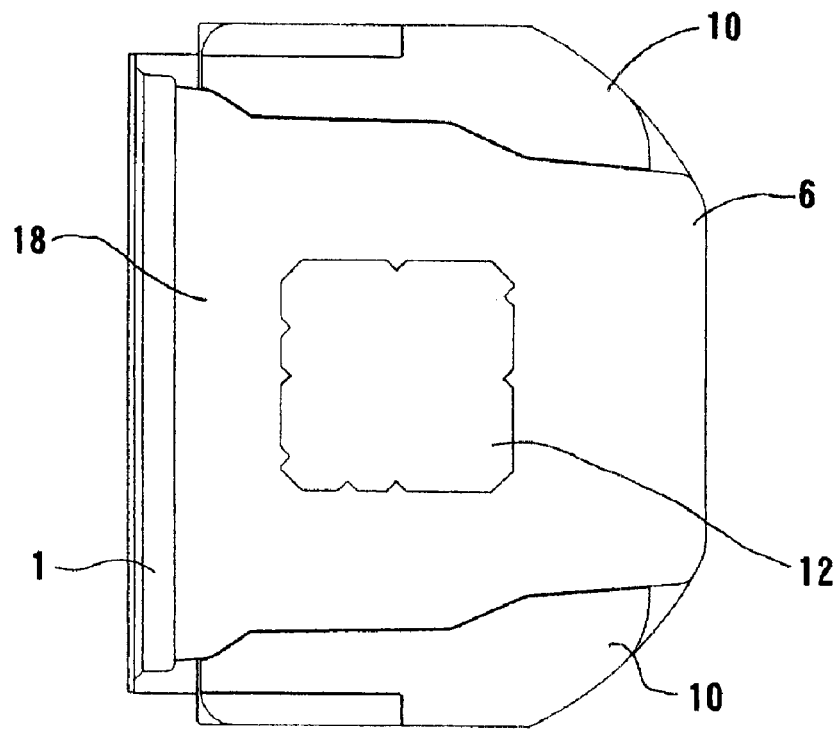
FIG. 1 is a plan view of a substrate transport container in a first embodiment of the present invention.
Figure 2:
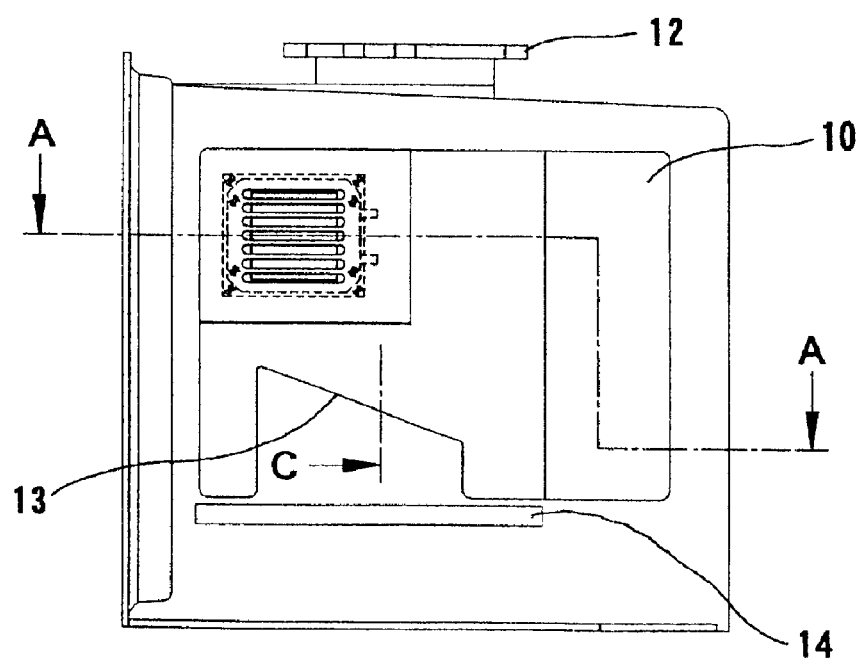
FIG. 2 is a side view of a substrate transport container in the first embodiment of the present invention.
Figure 3:
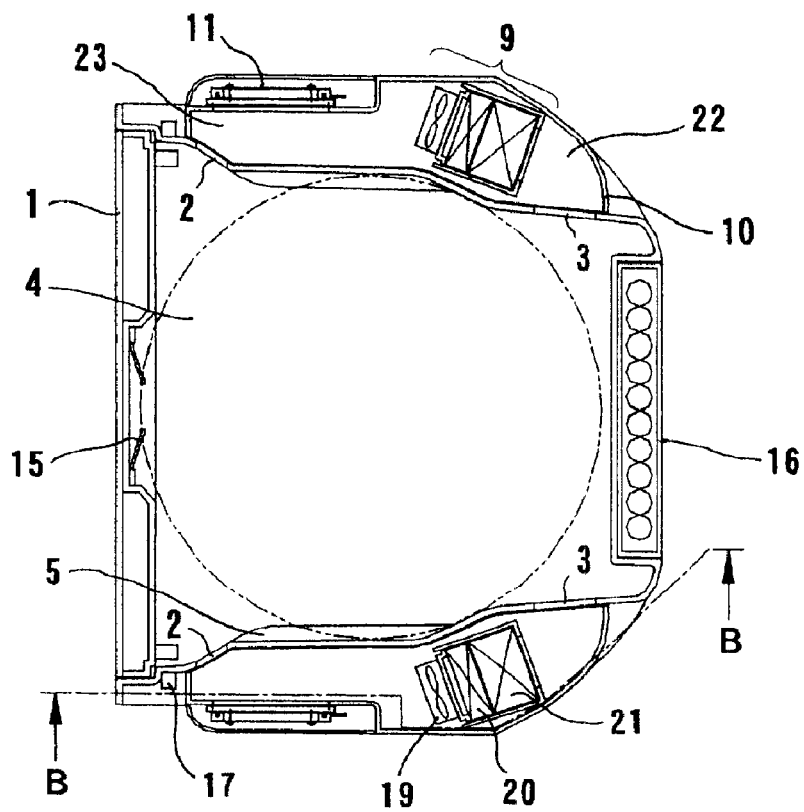
FIG. 3 is a cross-sectional view through a plane A—A of the substrate transport container in FIG. 2.
Figure 4:
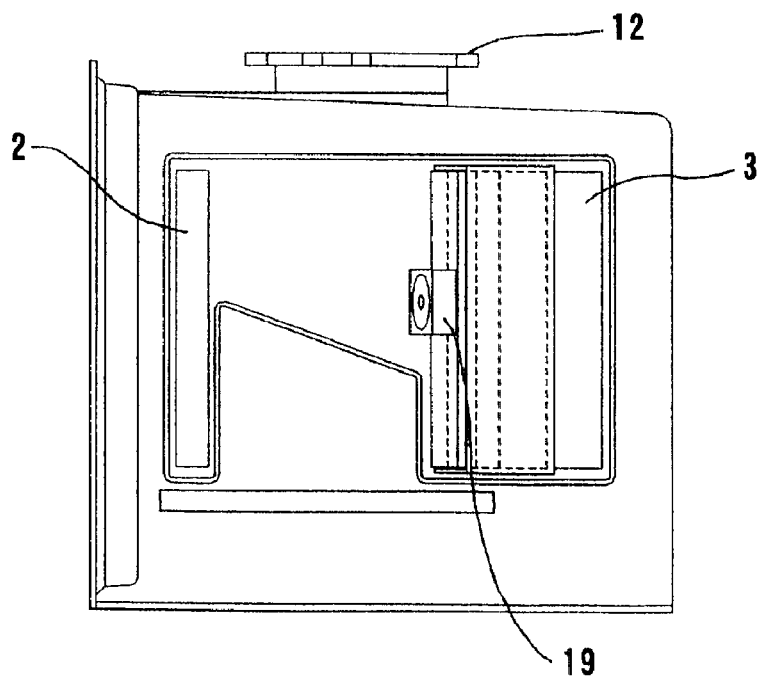
FIG. 4 is a side view through a plane B—B of the substrate transport container in FIG. 3.
Figure 5:
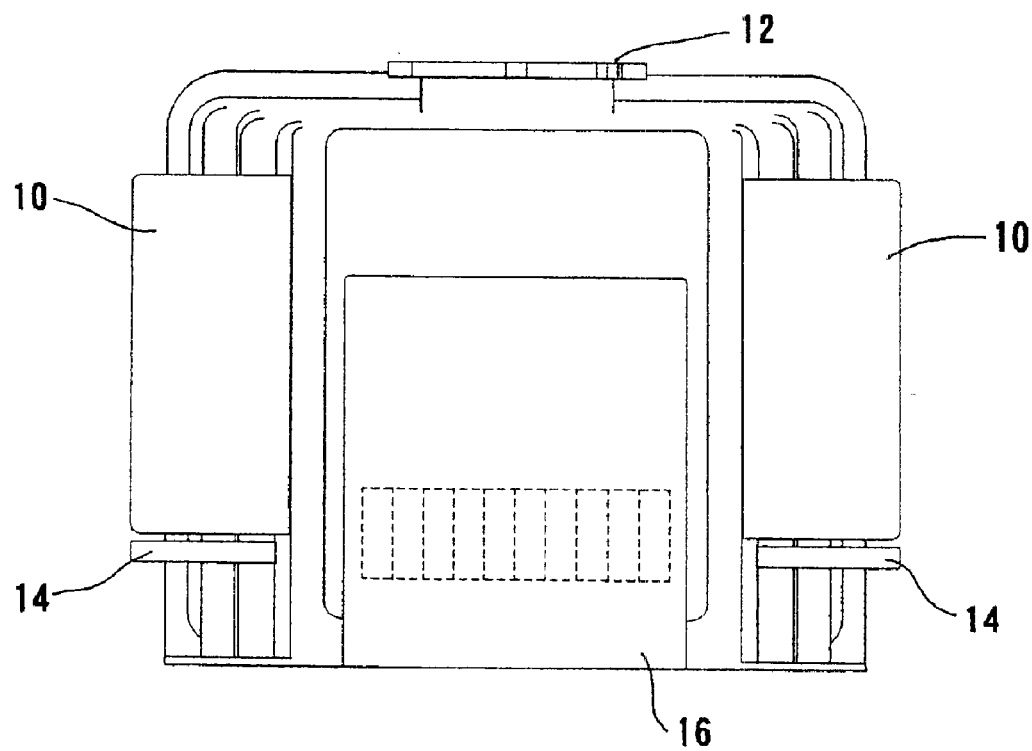
FIG. 5 is a back view of the substrate transport container in the first embodiment.
Figure 6:
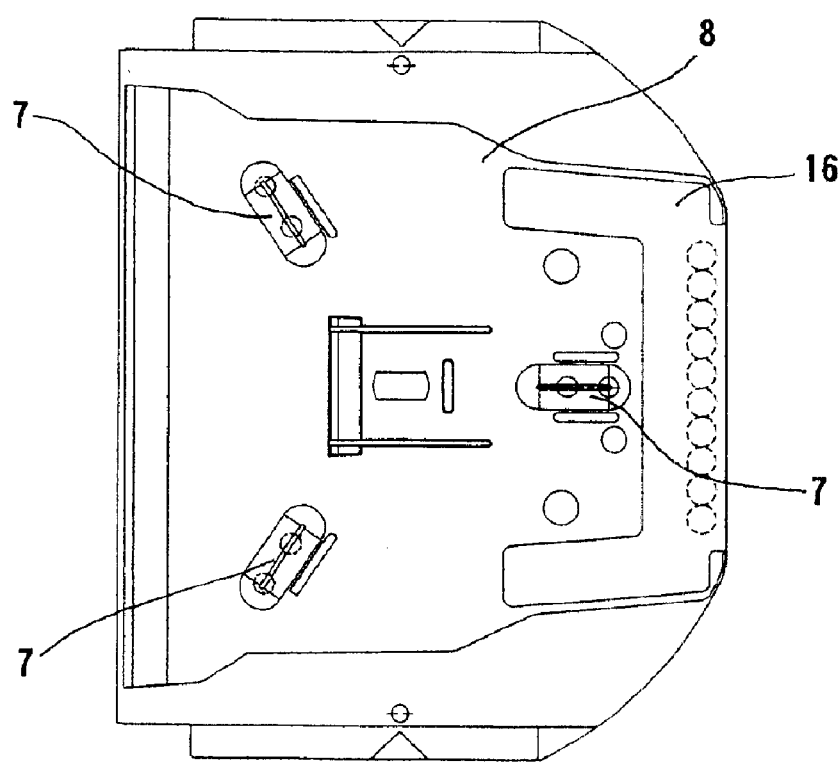
FIG. 6 is a bottom view of the substrate transport container in the first embodiment.

Preferred embodiments will be explained in the following with reference to the drawings attached.

First, the necessity for a substrate transport container (pod), which is compatible for automation in semiconductor device manufacturing plants, will be explained. To prevent human errors by workers and contamination of substrates such as semiconductor wafers by organic substances and minute quantities of ammonia generated from the workers, it is effective to distance the workers from the space used for handling the substrates. Therefore the introduction of process automation is required as a means for achieving such preventions of contaminations. Substrate transport container for use in such automated facility includes SMIF (standard mechanical interface) pod and FOUP (front) opening unified pod), which are used in conjunction with door opener that positions the apparatus at a specific location and opens a door externally and is used in conjunction with automated transport apparatus. An a automated facility used in a semiconductor production plant and the like is specified by SEMI standard as to its structure, size, operational manner and testing method, and others. The purpose of the SEMI standard is to define common standards for semiconductor manufacturing apparatuses and associated equipments, electrical and communication devices, materials, and safety. By so doing, the final users are able to combine apparatuses and others that are made by different manufacturers and the manufacturers are able to design the apparatuses with reasonable design margin for avoiding excessive specifications and to aid in achieving lower costs. For example, for a FOUP type substrate transport container designed to carry 300 mm wafers, the external size of the apparatus, receptor for positioning pin, shape of the handling flange, size and the like are defined in the standard. If a product should deviate from the specification of the standard, it can cause problems such as it cannot be transported by the transport facility or it cannot be stored in a warehouse.

The concentrations of target substances for reduction inside the substrate transport container should be, for example, for micro-particles of larger than 0.1 $\mu$m, less than 1000 pieces/m$^3$, preferably less than 100 pieces/m$^3$; for acidic gases, less than 1 $\mu$g/m$^3$, preferably less than 0.1 $\mu$g/cm$^3$; for base gases, less than 1 $\mu$g/cm$^3$, preferably 0.5 $\mu$g/cm$^3$; for organic substances having a boiling point higher than 80° C., less than 1 $\mu$g/cm$^3$, preferably less than 0.5 $\mu$g/cm$^3$, the absolute humidity should be less than $4\times10^{-3}$ g/g (relative humidity 20% at 25° C.), preferably less than $1\times10^{-3}$ g/g (relative humidity 5% at 25° C.). Also, when the humidity is lowered, the substrates stored are susceptible to be statically charged, and may cause damage to elements such as FET, condensers and the like, and therefore, stored substrates should be grounded. Methods for grounding include the use of conductive wafer carriers, or semiconductor wafers are stored in a wafer carrier having metallic terminals for grounding, or make the wafer carrier from an electrically conductive material.

The first embodiment of the present invention relates to a highly hermetic container for accommodating a plural of substrates therein, and is constructed so that a door for wafer transferring is provided on a side surface, and is ready for use in automated facility. The minimum conditions necessary for an automation compatible container are: (1) a door provided with a mechanism for opening and closing by an external door operation device, (2) a container main body that can engage with the door and maintain a hermetic atmosphere, (3) a substrate holding means for keeping the substrates separate at a given distance disposed in the container main body, (4) a holding device for a robot to externally engage with the container disposed in the upper section of the container, and (5) a receptor section disposed in the bottom of the container to engage with the positioning device of the apparatus. Optionally, it should also have: (6) a pressure difference modifier for leveling internal/external pressure difference, (7) a holding device for an operator to handle the container, (8) a holding device provided on the container so that a robot can engage externally, and (9) a data communication device to store and communicate information such as a lot number of the substrates. The first embodiment satisfies at least the conditions (1) to (5), and furthermore, is provided with air conditioning apparatus such as a particle removal device for the container interior, a gaseous contaminants removal device, dehumidifying device and operational control devices including an electrical power source.

Next, specific structures of the first embodiment will be explained with reference to FIGS. 1 through 7. The essential components are: a door 1 having a latching mechanism that is operable externally by a locking/unlocking device; a container main body 6 having opening sections 2, 3 for allowing the internal atmosphere of the container main body to communicate with air conditioning means and made as a unit body with a holding device 5 for holding the substrates 4 at a given distance; a bottom surface receptor section 8 having a receptor section 7, for seating the container in a specific location, for engaging with the positioning device of the apparatus; a first air conditioning apparatus 9 disposed on the outer surface of the container main body 6; a cover 10 that covers the first air conditioning apparatus 9 and the opening sections 2, 3 and serves as an isolation wall for the outer environment of the container as well as a circulation path; a second air conditioning apparatus 11 disposed in the cover 10; a first holding device 12 disposed on the upper section of the container main body 6 for engaging with the robot; a second holding device 13 for use by the operator; a third holding device 14 for use by the robot; a substrate fixing device 15 for fixing the position of the substrates; a power source 16 disposed in the rear section of the container main body 6, that is, opposite to the door 1; and a door status detection device 17 disposed on the door 1 and/or container main body 6. These key components are assembled to produce a substrate transport container 18.

The substrate transport container 18 has the door 1 for transferring the substrate on its front surface and is designed to hold the substrates 4 at a given separation distance inside the container main body 6. The substrates 4 are held at a given separation distance by means of a comb-shaped holding section 5 provided inside the container main body 6 (refer to FIG. 3). Also, the substrates 4 are pressed towards the rear surface side of the container main body 6 and held in position by means of the substrate fixation means 15 served by a spring member provided on the door 1.

On both lateral surfaces of the container main body 6, a cover 10 is disposed to serve as an isolation wall to isolate from the external environment of the container, and the air conditioning means is placed in the space formed between the container main body 6 and the cover 10. The container main body 6 communicates with the space inside the cover 10 through opening sections 2 and 3 so as to circulate the air conditioned by the air conditioning means through the space inside the container main body 6. In the space produced inside the cover 10 are provided: the air conditioning means comprised by a motor fan 19, a chemical filter 20 for reducing the level of gaseous contaminants and a filter 21 for reducing the level of micro-particles. Also, a dehumidifying means 11 comprising a solid polymer electrolytic film is provided to control the humidity of the container interior. Air cleaned by such air conditoning means is supplied to the storage section of the substrates 4.

In the substrate transport container 18, air conditioning mechanisms for relatively heavy weight are disposed symmetrically inside the cover 10 with respect to lateral sections of container main body 6, left and right, and the power source 16 and the door 1 are placed roughly symmetrically with respect to front and back sections of the container main body 6. Therefore, it is possible to provide the air conditioning mechanism described above, even though the size is compact to meet the specification of the SEMI standard. And, because those components that are relatively heavy are placed symmetrically with respect to left/right and front/back sections of the container, the center of gravity substantially coincides with the center of the substrate transport container, so that when the container is suspended by the holding means 12 provided on the upper surface of the container main body 6, the center of gravity of the container is coincided to the holding means 12 so that the container can be handled in a stable manner. Also, the cover 10 is provided with a holding means 13 for manual handling (refer to FIG. 7) so as to facilitate manual handling of the container.

The power source 16 is divided into two types depending on the operational mode. The first type is provided with at least a secondary battery and a board to control the operation of electrical driver parts and a power supply terminal for external powering. The power source uses the secondary battery when external powering is not possible. The conditions for the electrical driver parts are given by the internal control board to determine the operational parameters such as operation patterns and rotational speed of the air circulation device. The second type is provided with at least an external powering terminal. This is used to operate the electrical driver parts such as the motor fan only when external powering is possible. Therefore, the control board can also be disposed on the container or the external powering device. It is permissible to dispose an information communication device in the vicinity of the power supply terminal as necessary.

The air conditioning means are divided into two types. The first air conditioning means is a particulate contaminants removal device, a gaseous contaminants removal device, a holding device for fixing the contaminants removal devices and an air circulation device. The second air conditioning means is a dehumidifying device. The first air conditioning apparatus is attached to a side surface of the casing 6 or interior of the cover 10. The second air conditioning apparatus is attached to the cover 10 in this example. The location for the second air conditioning apparatus is not limited to the cover 10, such that any location including the casing or door is acceptable. Also, although not shown in the diagrams, a third air conditioning apparatus may be provided upstream of the air circulation device, as necessary. This third air conditioning apparatus is comprised by a particle removal device or a gaseous contaminants removal device, or both of these devices, and a holding device for fixing the removal devices. It is desirable that the first, second and third air conditioning apparatuses are disposed on left and right, but they may be place on one side. For example, a method of operating a system having a plurality of first, second and third air conditioning apparatuses is to operate the air circulation device and/or dehumidifying device on one side and stop the operation of the air circulation device and/or dehumidifier on the opposite side. By so doing, it is possible to adjust the concentrations of particles, gas contaminants and humidity inside the container. It also enables to extend the operation of a battery driven system.

Next, the flow of the gas inside the container will be explained. The gas circulated by the air circulation device (fan motor) 19 passes through the gas contaminants removal device 20, particle removal device 21, a first flow path 22, and flows into the interior of main body 6 through the opening section 3 provided on the main body 6. Clean gas entering into the main body interior flows towards the center region of the substrates 4 and to the opening section 2 provided near the door 1. Then, it is dehumidified in the dehumidifying device (second air conditioning apparatus) 11 disposed near the second flow path 23, and returns to the air circulation device 19 to complete the circulation circuit. It is permissible to provide a porous plate or a net-like member on the downstream side of the particle removal filter for the purposes of equalizing the stream speed and protecting the filtering materials.

In this flow circuit, even when the door 1 is opened to let the substrates 4 transfer into/from the container, a flow of air towards the door 1 (opening section 2) is formed in the vicinity of the door 1 by the air conditioning apparatus 9 so that the substrates 4 are not easily contaminated. The operation of the air circulation device 19 can be controlled by detecting whether the door is closed by an optical, magnetic or mechanical detector 17 so as to enable operation only when the door is closed. When the fan motor is operated if the door is open, the service life of the chemical filter may be shortened by the introduction of external atmosphere containing various contaminants into the container. Another objective is to prevent contamination of the internal surface of the container by the external atmosphere.

Detection devices include mechanical switches, proximity switches and photo-electric sensors. Mechanical switches are the most common means of detection, and include button type, rotary type, sliding type, joy stick type, torque type, and miniature models are available in the marketplace. Proximity switches detect an approaching object by means of magnetic or electric field. They are non-contacting type detectors, and are effective when the detection object is metallic or non-metallic. Photo-electric sensors include scatter reflection type, mirror reflection type and transmission type. In the scatter reflection type, its operation is based on light emitting from the emission section illuminates an object and is scattered/reflected, and a portion of the reflected light returns to the receiver section. In the mirror reflection type light emitted from the emission section is reflected by the mirror to return to the receiver section, and operates when an object shields the light. In the transmission type, emission section and receiver section are placed in different locations, and an object is detected when it shields the light path between the emission and receiver sections. In the above embodiment, any of these methods may be used by considering the size, shape, price and reliability of each method. The door status detection device 17 may be omitted.

Next, various contaminants removal devices will be explained.

It is common to use an air filter for removal of particles from the air. According to the JIS standards, the filters are divided roughly into the following four types depending on the target particle size and capturing efficiency and other requirements.

(1) Rough particles filter: used mainly to remove particles larger than 5 $\mu$m.
(2) Medium performance filter: used primarily to remove particles smaller than 5 $\mu$m size at a medium efficiency for capturing particles.
(3) HEPA filter: an air filter having particle capturing efficiency of higher than 99.7% for particles of 0.3 $\mu$m size, and pressure drop of less than 245 Pa at the standard flow rate.
(4) ULPA filter: an air filter having particle capturing efficiency of higher than 99.9995% for particles of 0.1 $\mu$m size, and pressure drop of less than 245 Pa at the standard flow rate.

The particle removal device 21 made of a HEPA filter or the ULPA filter should be used. The ULPA filter is generally constructed so that folded filter member is provided with spacers to secure flow passages. The pressure drop through the ULPA filter varies depending on the flow resistance of the filtering membrane and the manner of folding the membrane and uniformity of the passages. When the structure is such that the opening area of the filter is small, the length of the flow passage should be increased and it is preferable to use filters having low pressure drop by packing more filtering medium. Filtering media are available commercially in various materials such as glass fibers and fluoride-based resins, and any such flittering medium may be used, but it is preferable to use fluoride-based resins that offer superior chemical resistance, low gas emission and low flow resistance. When the opening area can be made large, it is preferable to decrease the depth of flow so as to maximize the utilization of the limited space available.

A frame made of aluminum or a stainless steel (SUS) or a polymer is filled with folded HEPA or ULPA filter. The folded filter member has partitions called ribbons at the apexes of the filtering medium. The ribbons serve to maintain a constant separation of the folds to secure passage of air through the filter member. The folded filtering medium is affixed to the outer frame. Instead of the ribbons, the filter member may be embossed to secure the flow passages or the ribbon may be eliminated. Also, when the outer frame is made of a polymer, attachment may be made by fusing instead of using adhesive. Instead of the ribbons, wave-shaped separators may be used. Also, if flow resistance is low, filtering member may be used in a plane form without any folds.

Filtering media for particle filtering include PTFE, glass fibers, non-woven cloths, recycled products. The structure of the filter may include folded structures (pleats, mini pleats), membranes (sheet type), corrugation and hollow fiber membranes.

The particle filters are used as an assembled unit by surrounding the filtering medium in an outer frame. To prevent the captured particles from being detached from the filter, it is necessary to seal between the filter members and the outer frame. A general method of sealing is to use an adhesive. It is also possible to pressure-bond the filtering medium to the outer frame. The adhesive includes urethane-based or epoxy-based resins, and furthermore, when the outer frame is made of a polymeric material, filter members may be fused to the frame.

The gaseous contaminants removal device 20 may be chosen depending on the target substance. Basic gases can be removed effectively by the use of strongly acidic or weakly acidic cation exchange non-woven cloth or fibers, or strongly acidic or weakly acidic cation exchange beads. They can also be removed by the use of activated charcoal or ceramics coated with an acidic chemical. Acidic gases, boron, and phosphorous may be removed effectively by the use of strongly basic or weakly basic anion exchange non-woven cloth or fibers, or strongly basic or weakly basic cation exchange beads. They can also be removed by the use of activated charcoal or ceramics coated with a basic chemical. Organic substances can be removed by activated charcoal, activated carbon fibers, zeolite, molecular sieve, silica gel and porous ceramics. Ozone can be removed by the use of a carrier medium made of manganese dioxide in the form of grains or sheet or by attaching them to a carrier, or activated charcoal coated with manganese dioxide. Also, ionized metals in a vapor form, for example, copper sulfide, can be removed by non-woven ion exchange cloth or ion exchange beads. The structure of adsorbing material can be chosen to suit the allowable size of the filter, shape and pressure drop.

Ion exchange non-woven cloth and fabrics can be obtained, for example, by introducing ion exchange radicals by a radioactive graft polymerization reaction. That is, many activated sites are generated on a starting material comprised by organic macromolecules, such as polyethylene, polypropylene, or natural polymeric fibers or cloth such as wool and cotton by treating with radiations such as electron beam or gamma beam radiation. These activated sites are very reactive and are called radicals, and it is possible to impart properties of the monomer different than those of the base material by the radicals.

Because this technique is based on attaching monomers to the base material, the reaction is called graft polymerization. By applying radioactive graft polymerization to bind polyethylene non-woven fabric with monomers, for example, styrene sodium sulfite, acrylic acid, aryl-amine, having ion exchange radicals such as sulfone group, caboxyl group, amino group molecules, it is possible to obtain non-woven ion exchange body having a significantly higher ion exchange speed than ion exchange beads or so-called ion exchange resins. Similarly, after binding monomers that are capable of incorporating ion exchange radicals, such as styrene, chloromethyl-styrene, glycidyl-methacrylate, acrylonitrile, acrolein to the base material by radioactive graft polymerization, ion exchange radicals may be introduced to obtain an ion exchange body in the same shape as the base material.

The filter structure can be made of a single material or a plurality of materials. When a plurality of materials is to be used, activated charcoal particles and non-woven ion exchange cloth may be used, for example. In such a case, non-woven ion exchange cloth is used to clamp the particles or powder form of activated charcoal. Non-woven ion exchange cloth may be made into a sheet form or a folded form. They may be applied on a carrier body made of urethane, foam body, plastic, polymeric or metallic material. For example, activated charcoal particles on a urethane carrier and ion exchange resin on a urethane carrier; or activated charcoal particles on a urethane carrier and a urethane carrier impregnated with activated charcoal particles.

Further, the shape of the chemical filter may include a plate type, rolled core type, w-type, cylindrical type, plate-fin type, bypass type, and a three-dimensional skeletal type.

Next, dehumidifying agent and dehumidifier 11 will be explained. In this embodiment, dehumidifying unit based on solid electrolytic film is used. In this method, water molecules on the dehumidifier-side space is decomposed into hydrogen and oxygen using a catalyst, and hydrogen is removed through a solid polymer electrolytic film impressed with a voltage towards the outer side of the dehumidifier space, that is, hydrogen is discharged towards the moisture discharge side.

Figure 8:
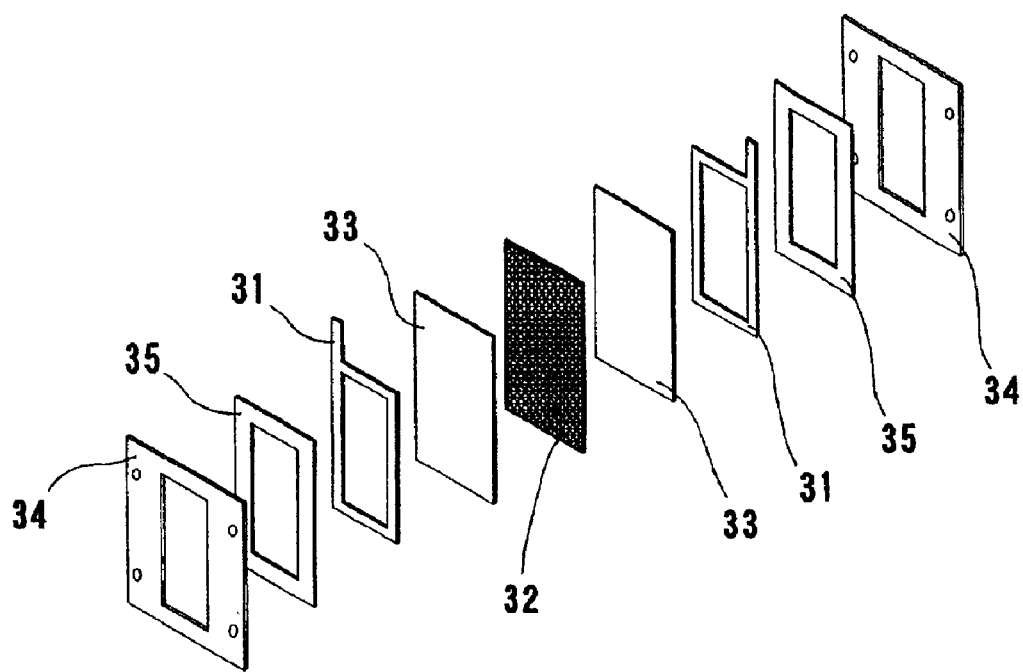
FIG. 8 is an exploded view of the humidifier based on solid polymer electrolytic film.
Figure 9:
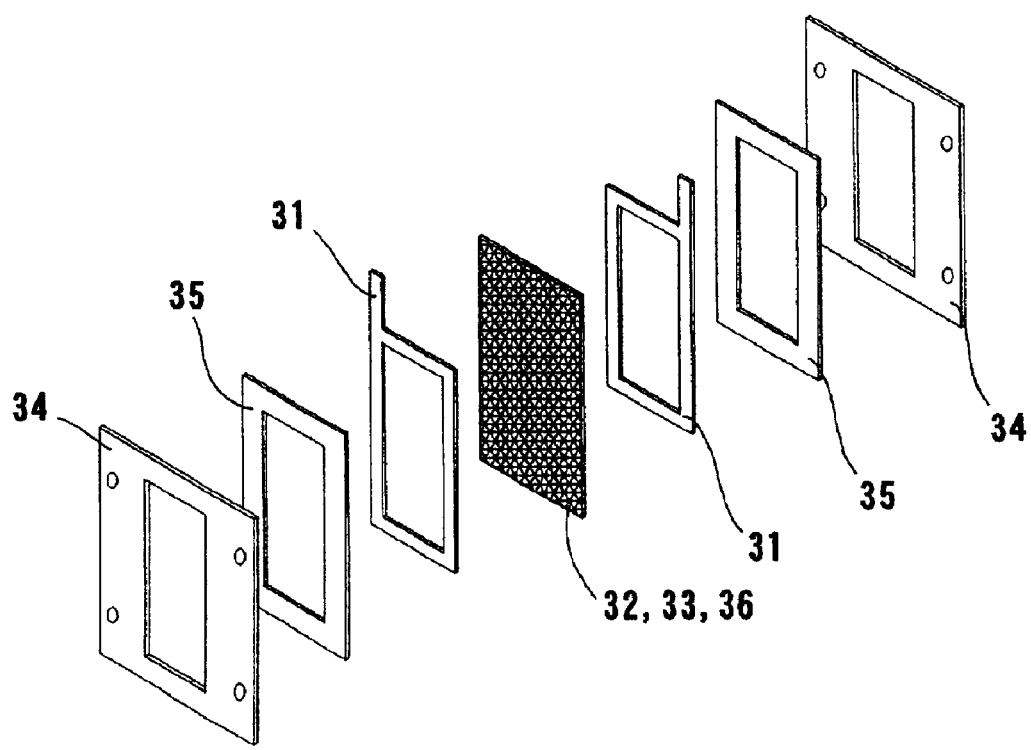
FIG. 9 is an exploded view of another humidifier based on the solid polymer electrolytic film.
Figure 10:
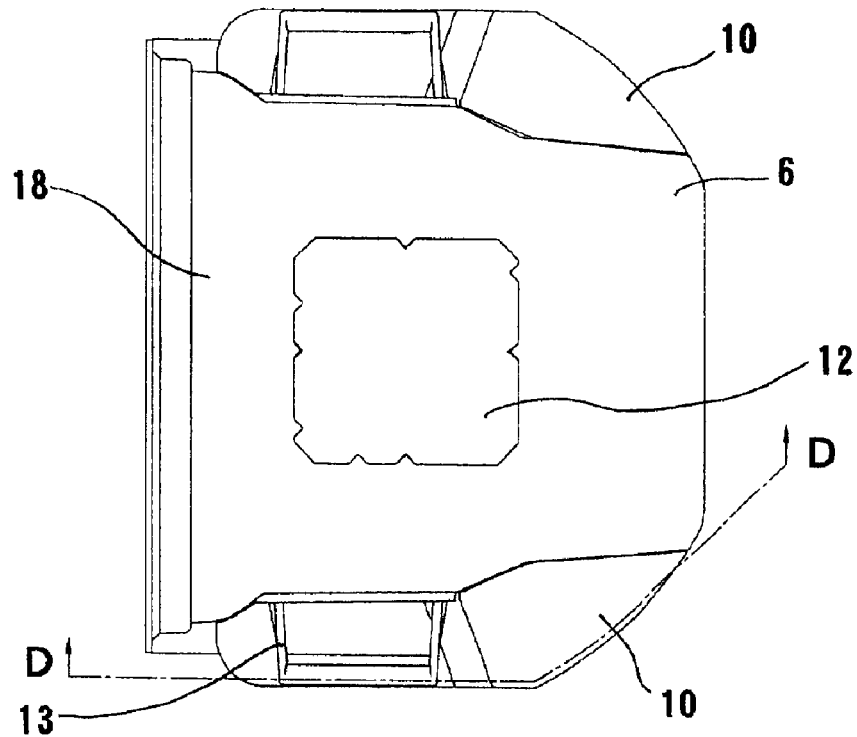
FIG. 10 is a plan view of a substrate transport container in a second embodiment of the present invention.
Figure 11:
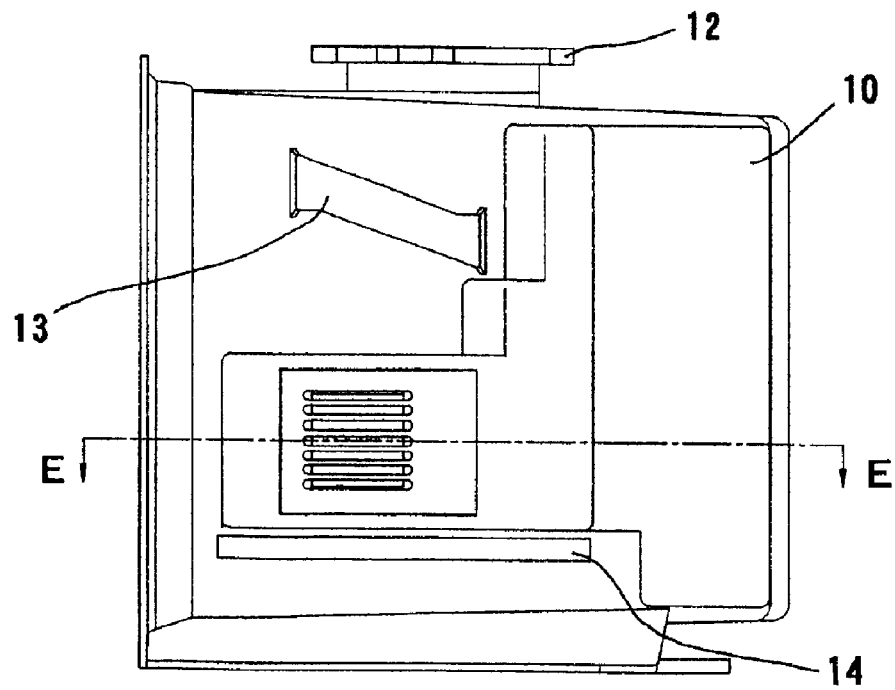
FIG. 11 is a side view of the substrate transport container in the second embodiment.
Figure 12:
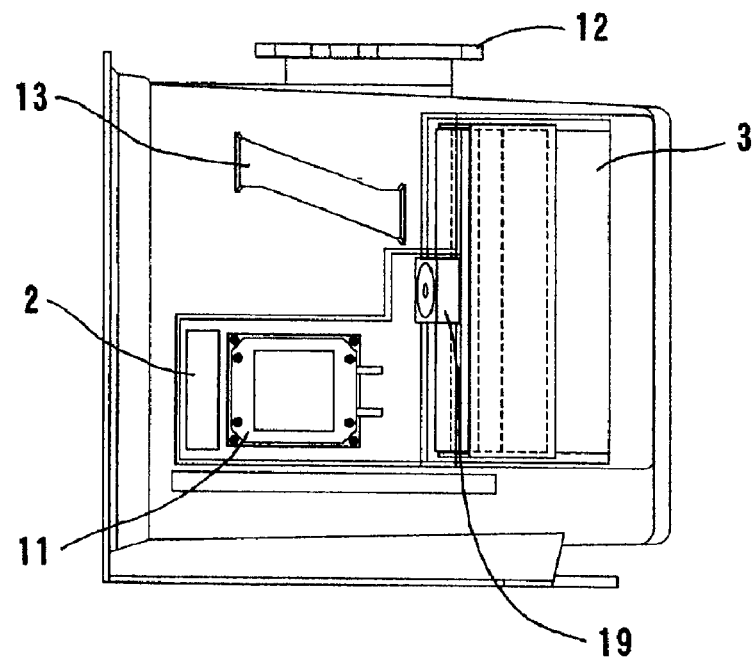
FIG. 12 is a side view of the substrate transport container through a plane D—D in FIG. 10.
Figure 13:
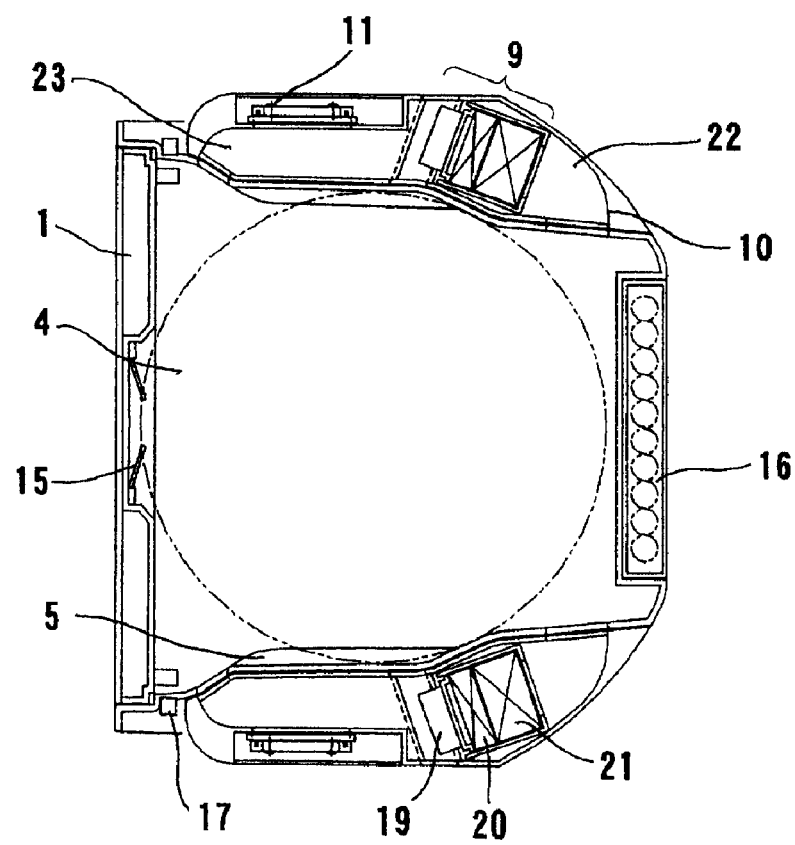
FIG. 13 is a cross sectional view of the substrate transport container through a plane E—E in FIG. 11.
Figure 14:
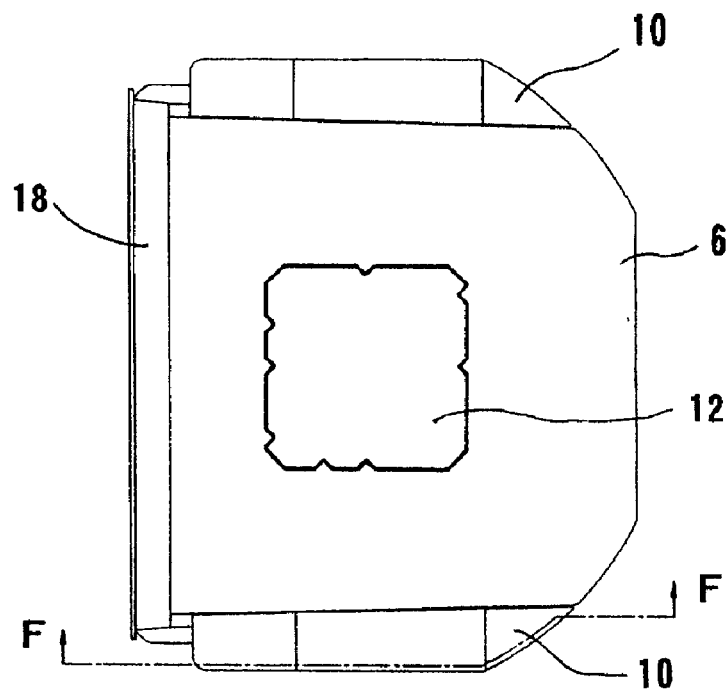
FIG. 14 is a plan view of a substrate transport container in a third embodiment of the present invention.
Figure 15:
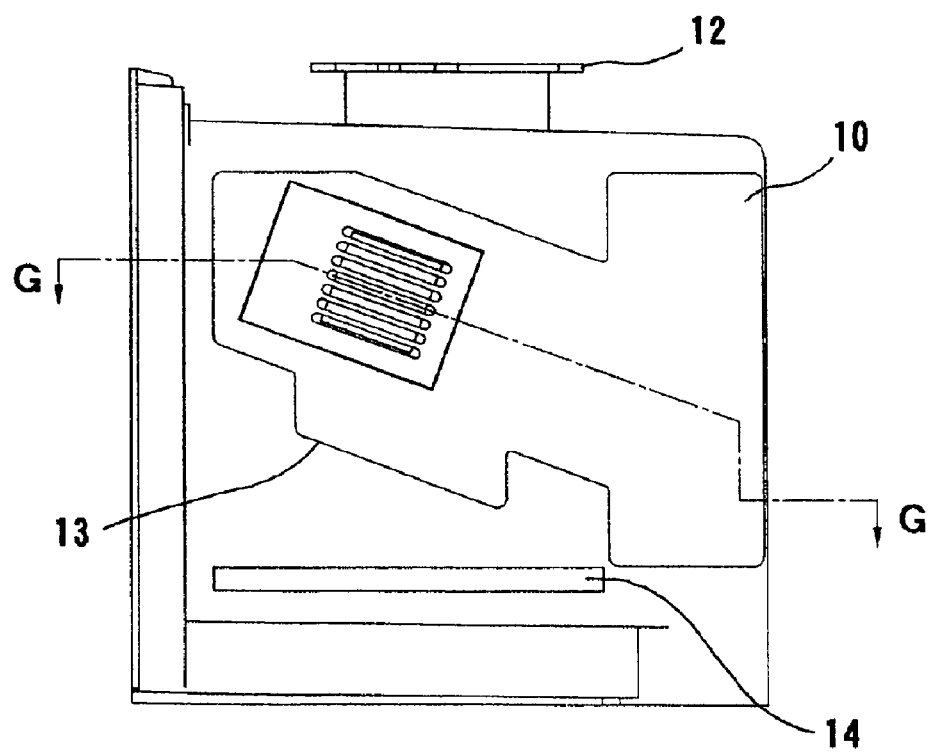
FIG. 15 is a side view of the substrate transport container in the third embodiment.

An example of a dehumidifying unit based on a solid electrolytic film is shown in FIG. 8. Essential components required for dehumidifier based on a solid polymer electrolytic film are: a flange electrode 31, a solid polymer electrolytic film 32 and a catalytic layer 33. The dehumidifying unit includes a fixed flange 34 for fixing the flange electrode 31 and a packing member 35, in addition to the components described above. A feature of this dehumidifying unit is that the catalytic layer 33 and the solid electrolytic film 32 are separated and formed individually. Another example of the dehumidifying unit based on solid electrolytic film is shown in FIG. 9. The feature of this dehumidifying unit is that the solid electrolytic film 32, porous electrode 36 and the catalytic layer 33 are assembled into a single unit. An example of the specific product is found in ROSAHL made by Ryosai Technica Co. Ltd.

The shape of the dehumidifying unit may be a square, rectangular, circular, oval or polygonal shape and others, but it is preferable to design it so that a ratio of the area of the flange electrode $S_F$ relative to the solid electrolytic film area $S_{SPE}$ be small. Specifically, the ratio $S_F/S_{SPE}$ is higher than 0.1 and less than 0.5, or more preferably higher than 0.01 and less than 0.3. If the ratio of the dehumidification area that contacts to gas to be processed to the flange electrode is the same, an oval shape is preferable than a circular shape and a rectangular shape is preferable than a square shape, and specifically, it is preferable to design so that the short axis and the long axis, or the short perimeter and the long perimeter, are related in a range of not less than 10% and not more than 90%. The solid polymer electrolytic film should preferably transmit protons, but it may be served by Nafion (registered trade mark)-117 made by DuPont Co, which has a nominal film thickness of 170 μm. It is also possible to use Nafion-115, or XUS-13.204.10 made by Dow Chemical Co., for example. It is preferable to use platinum or platinum black as the catalyst because of its capability and durability, but platinum on carbon carrier or other platinum group metallic catalyst may be used. It is preferable to use aluminum, titanium or stainless steel for the current terminal necessary for application of uniform voltage on the porous electrode. For packing material, PTFE is preferable because of its low emission of organic substance. Because the fixation flange contacts the process gas directly so that it is preferable to avoid using metals that are susceptible to corrosion by the process gas, so that polymeric materials are preferable, but if there is no danger of the dehumidifying unit being exposed to corrosive gases, aluminum, titanium or stainless steel may be used. Also, it is preferable to provide a guard having an opening section so as to avoid contacting the solid electrolytic film, that includes the catalyst and porous electrode, directly from outside.

Another method for removing moisture contained in air is to use methods of a dehumidifying agent containing primarily silica gel, zeolite (including synthetic zeolite), calcium carbonate, calcium chloride or magnesium chloride. When using a dehumidifying agent, it is preferable to use an agent such as silica gel, which can be reused after regenerative heating and is available in a cartridge form for easy replacement that can be carried out automatically. Another method that may be considered is to cool the container or insert a cooled rod inside the container for a given time to collect the frozen moisture for removal.

In any such methods, dehumidification is enabled in a short time by circulating the atmosphere inside the container. In the embodiment of the present invention, any dehumidification method may be used so long as the devices for dehumidification can be installed in the container. Also, it is possible to reduce the time for achieving low humidity inside the container by introducing high purity nitrogen or inert gas or dried air from the supply/exhaust port provided at the main body or door for replacing the interior atmosphere with using together with dehumidification methods.

Also, it is permissible to use both electric-type dehumidifier and moisture absorbing material (activated charcoal, ion exchange agent, silica gel and the like). This is to maintain the moisture absorbing material in the active initial stage, which exhibits the fastest absorption speed, at all times by keeping the absorbing material in the dry state at all times by using the electric dehumidifier. Further, the use of a container having a means for forcibly circulating an inert gas (gas purging) therein achieves low humidity in the shortest possible time. Whether the means for creating a gas flow is a fan or gas purging, it is preferable to circulate the gas at least once or more, or more preferably more than three times during the duration between wafer storing and wafer removal, such that the number of circulations can be adjusted according to the environment required by the stored substrates or the degree of contamination existing in the outer environments before and after the current process in relation to the degree of cleanliness. If there is no restriction on the power consumed by the fan, it is most preferable that the gas be circulated constantly. Here, it should be noted that "the environment required by the stored substrates" refers to the creation of an environment inside the container during transit between the processes so that all or any particular species of contaminants in the container that may reduce the yield, such as particulate matters, ions, dopants, gaseous contaminants including organic substances, and moisture are kept below the target control level.

Here, when the object is to maintain low humidity, it is better to use a material that has a low moisture absorption factor for the container. This is because, in a typical environment of 25° C. and 50% relative humidity (RH) generally adopted for cleanrooms, if the interior of the container only is reduced in humidity, (1) moisture contained in the polymeric materials that comprise the container migrates towards the low humidity side due to the humidity gradient, (2) the moisture contained in the environment external to the container migrates towards the interior of the container due to humidity gradient between the interior of the container and the external environment, and (3) air in the external environment leaks into the interior of the container through the joints of the container. These three reasons cause the moisture to migrate towards the interior of the container which is maintained at a lower temperature. When the container is highly hermetic, of the three reasons cited above, the factor that most affects the rise in humidity in the interior of the container is the above-noted (1) moisture contained in the polymeric materials that comprise the container migrates towards the low humidity side.

Measuring of water absorption factor of polymeric materials is specified according to ASTM (American Society for Testing and Materials) D570 standard, and is reproduced in literature or polymer maker's catalogue and the like. Polycarbonate (PC) is used often for making substrate transport containers, but the water absorption factor of PC is 0.2–0.3% so that the container main body and the door weighing 3 kg would contain 6–9 g of moisture. By using a material having water absorption factor of at least less than 0.1%, it is possible to reduce the amount of moisture that can be migrated inside the container, and contributes to improving the performance of the dehumidifier. Polymeric materials of less than 0.1% water absorption factor include: PE (polyethylene) <0.01%; PP (polypropylene) 0.03%; PBT (polybutylene terephthalate) 0.06–0.08%; PPS (polyphenylene sulfide) 0.02%; PTFE (polytetrafluoroethylene) <0.01%; PC/carbon (polycarbonate with 20% added carbon) 0.1%; and PBT/carbon (polybutylene terephthalate with 20% added carbon) 0.05%. Of these substances, for constructing the substrate transport container, it is preferable to use PPS (polyphenylene sulfide) or PBF (polybutylene terephthalate) or the above-mentioned materials with carbon addition that show characteristics of chemical resistance, superior high temperature properties and low mold shrinkage. The material may be an alloy material produced by mixing different materials so long as the material can satisfy the properties mentioned above.

Also, because wafers are susceptible to becoming statically charged when the humidity is low, it is preferable that an electrical conductor with added carbon be used to construct the container, at least at the wafer support section that contacts the wafers, the grounding portion that grounds the container and connecting portion to the wafer support section. The polymeric materials in general are classified as follows: those having surface resistivity $1 \times 10^3 - 1 \times 10^8 \Omega$ are classified as static-charge conductive materials; those having $1 \times 10^5 - 1 \times 10^{12} \Omega$ as static-charge dispersing materials; and those with values higher than $1 \times 10^{12} \Omega$ as insulating materials. Also, those material having volume resistivity $1 \times 10^2 - 1 \times 10^5 \Omega \cdot cm$ are classified as static-charge conductive material; those having $1 \times 10^4 - 1 \times 10^{11} \Omega \cdot cm$ as static-charge dispersing material; and those with values higher than $1 \times 10^{11} \Omega \cdot cm$ as insulating material. In the embodiment of present invention, it is preferable that the surface resistivity be less than $1 \times 10^{10} \Omega$; and volume resistivity be less than $1 \times 10^9 \Omega \cdot cm$, or more preferably surface resistivity be less than $1 \times 10^8 \Omega$; and volume resistivity be less than $1 \times 10^7 \Omega \cdot cm$. Also, because the non-woven ion exchange cloth and activated charcoal used for gaseous contaminant capture medium contain adsorbed moisture immediately after their production, it is preferable to dry them before use.

As described above, when various filters and power source 16 are installed on the container, the center of gravity of the container shifts to the filter side. If it is attempted to transport the container in the OHT system, for example, by grasping the robot holding device 12, for example, while its center of gravity is displaced towards one side, there is a danger of damaging the hoist and others on the OHT system. To avoid such a problem, it is desirable to reduce the weight of the filter and the power source 16. Further, a counter weight may be placed near the substrate transport door 1 and/or near the opening section of the casing 6. Another method is to increase the weight of the door 1 by using metal for making the latching mechanism housed in the door 1 to adjust the center of gravity. By adopting such measures, it is preferable to adjust the center of gravity in the horizontal direction so as to locate within 90% of a circle of the radius of the substrate, or more preferably within 70% of a circle of the radius of the substrate.

On a side surface of the power source section, a terminal is provided for supplying electrical power. It is necessary that the power source be provided with at least the ability to charge a secondary battery. Preferably, powering of the air circulation device and dehumidification device is carried out at same time using a separate circuitry. In general, the storage capacity of the secondary battery gradually drops as it is repeatedly subjected to charging and discharging cycles. It is possible to delay capacity degradation of the battery when the container is connected to an external power source by operating the electrical drive parts without discharging the battery. Accordingly, it enables reducing the frequency of battery exchange. On the other hand, another method of operation is not to provide the battery so that the system is operated only when it is connected to the external power source. By so doing, the necessity of the secondary battery and operational board is eliminated, leading to a reduction in the product cost. The location of the external power supply terminal is not limited to those shown in the example, such that it may be placed at any convenient location.

Various operations may be considered to the air circulation device depending on the manner of using the container. In general, the system may be operated continually, or the air may be circulated once or more every ten minutes in the initial stage of operation, or more preferably once or more and less than 10 times every minute. By doing so, contaminants brought into the container are removed actively. After the system has been operated for some time, the flow velocity may be lowered or the system may be operated intermittently so as to prevent contamination of the substrates W stored in the container generated from the constituting components of the container. By so doing, reduction of power consumption is possible, resulting in less frequency for recharging the secondary battery.

A second embodiment of the present invention is shown in FIGS. 10 through 13. The difference between this embodiment and the first embodiment is that a second handling device 13 for manual handling of the container is provided independently (refer to FIGS. 10 and 11). Other features such as the air conditioning apparatus and flow paths are basically the same as those in the first embodiment.

Next, a third embodiment of the present invention is shown in FIGS. 14 through 17. The main difference from the first embodiment is that the holding device 5 for holding the substrates 4 apart at a given distance and the main body 6 are provided as independent parts, and the particle removal device 21, the gas contaminants removal device 20 and the air circulation device 19 are provided independently (refer to FIG. 17). By arranging the components as described here, it is possible to obtain a compact structure that can be provided with an air conditioning mechanism.

Figure 18:
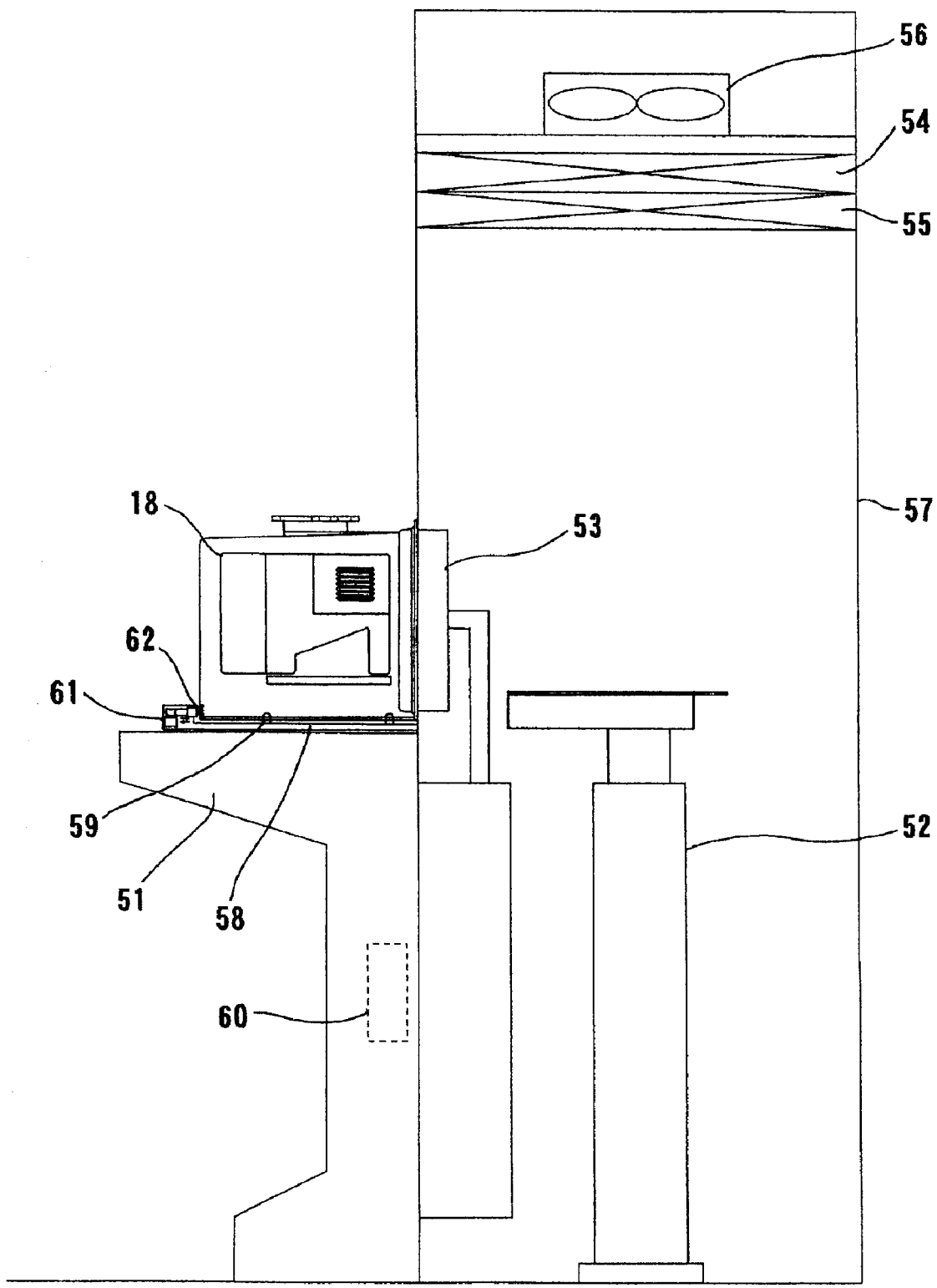
FIG. 18 is a side view of the substrate transport container seated on a loading port.

Next, methods for powering the container shown in the first to the third embodiments will be explained with reference to FIGS. 18 through 22. The substrates are transferred in and out of the container to processing apparatus through a dedicated load port. FIG. 18 shows a substrate transport container 18 seated on the load port 51. FIG. 18 also shows an enclosure 57 hosing a transport robot 52, a door opener 53, a ULPA filter 54, a gas contaminants filter 55, and a blower 56. The substrate transport container 18 is positioned by means of a positioning pin 59 provided on a movable platform 58. Then, the substrate transport container is fixed in place by a clamping device provided on the movable platform 58, and proceeds together with the movable platform in the direction of the door opener 53, so that the door can be opened (FIG. 18 shows such a state). A charging device 60 is disposed on the load port.

Figure 19:
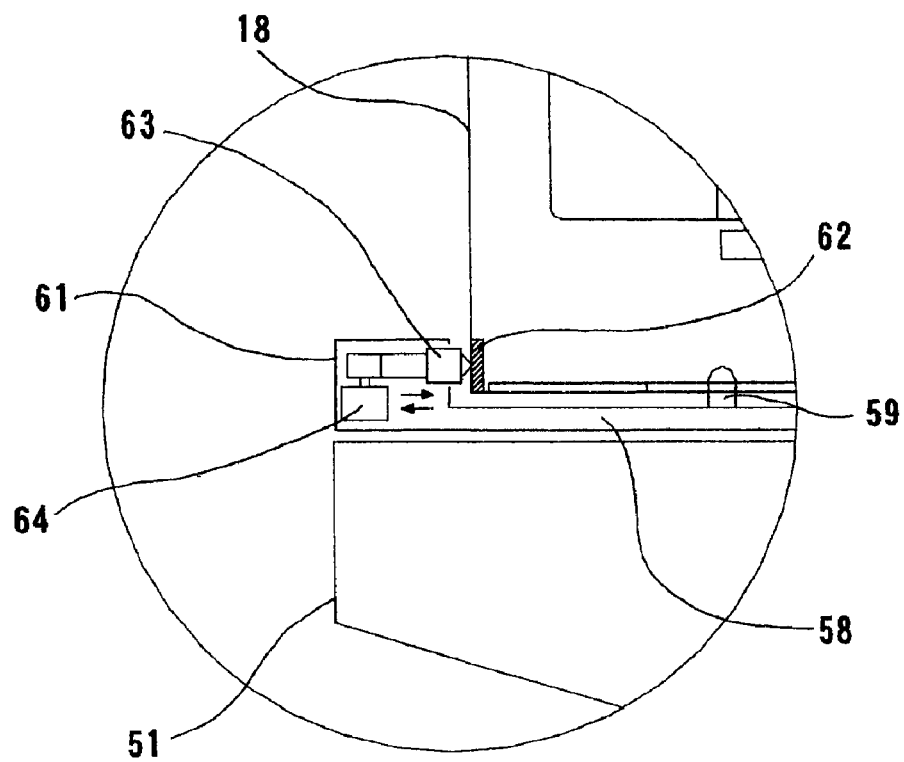
FIG. 19 is a side view to illustrate a method of powering the substrate transport container.
Figure 20:
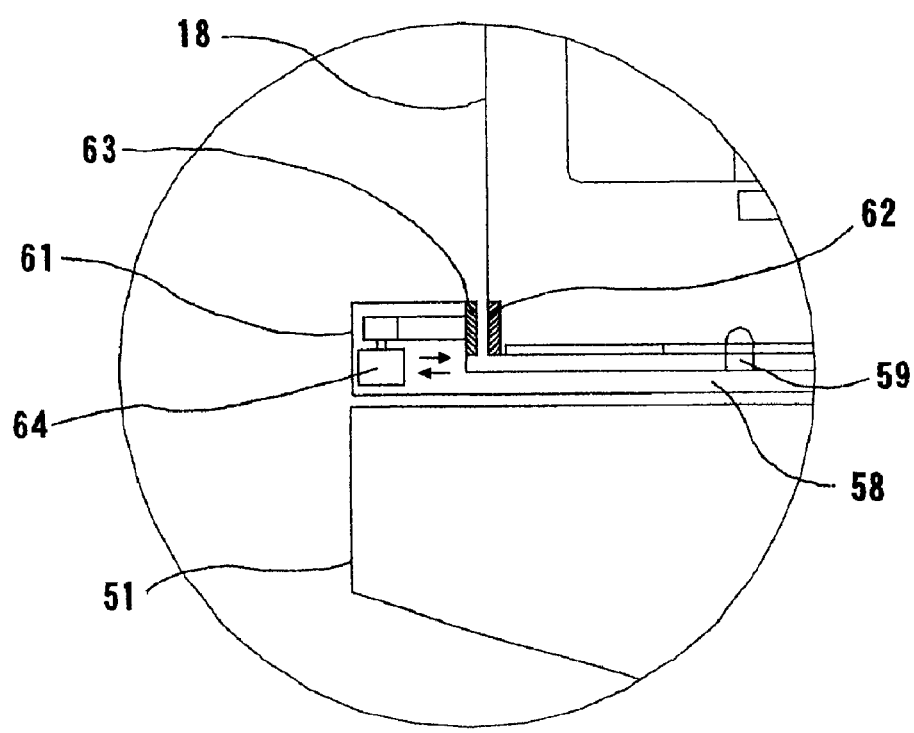
FIG. 20 is a side view to illustrate another method of powering the substrate transport container.

FIG. 19 is an enlarged view of the vicinity of the power supply terminal (powering) section 61. When the substrate transport container 18 is seated in a specific position on the load port 51, the power supply terminal 63 is moved by the driving device 64 from the power supply section 63 disposed on the movable platform 58 to touch the power receiving section 62, thereby enabling the power to be supplied. It is preferable to provide determining means to determine whether or not the substrate transport container 18 needs charging. Accordingly, by retracting the power supply terminal when it is not being used to supply power, and extending the terminal only when it is needed for powering, it is possible to prevent damaging the power supply terminal 63. Further safety measure may be taken to control the charging through the power supply terminal 63 according to the determining means. However, depending on the location of the load port in relation to the substrate transport container, the power supply terminal of the container may be disposed in the lower section, not on the side surface as shown in FIGS. 19, 20. Further, when the power supply terminal is located in the lower section, the powering terminal may be left in the protruded state without retracting the terminal. It is preferable that the power supply terminal is pressing at least by a spring to the apparatus side or the substrate transport side, or the metal terminal itself may have a spring action.

Figure 21:
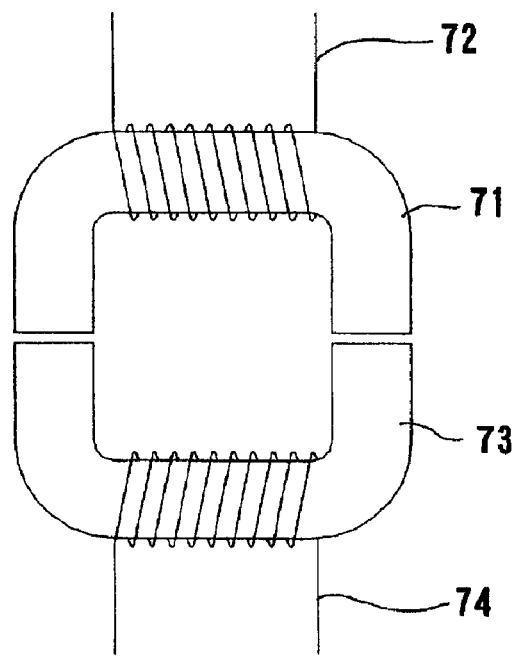
FIG. 21 is a conceptual diagram to show a principle of non-contacting powering of the substrate transport container.

Another method of powering is shown in FIG. 20. The difference between this method and the method shown in FIG. 19 is that powering is carried out by a non-contact method. This principle of the method is shown in FIG. 21. When a magnetic field varies around a conductor (coil), a voltage is generated and the current flows. This is the principle of electromagnetic induction. A primary coil 72 is wound on the primary coil side 71 and alternating current flows therein. Because the direction of flow of AC current changes periodically, a current is generated in the secondary coil 74. Because the current is generated in principle by changes in magnetic field, the primary coil 71 and the secondary coil 73 can be made non-contact. This method has been used as a proven method for charging electric shaver, electric brushes and electric cars. The feature of the electromagnetic induction type power supply are that no wear of terminals occurs because of non-contact, and there is no generation of sparks, no danger of electrical shock, and no danger of shorting when used in a wet environment. Also, contamination of the cleanroom by the dust generated due to sparking and the like can be prevented.

Figure 22:
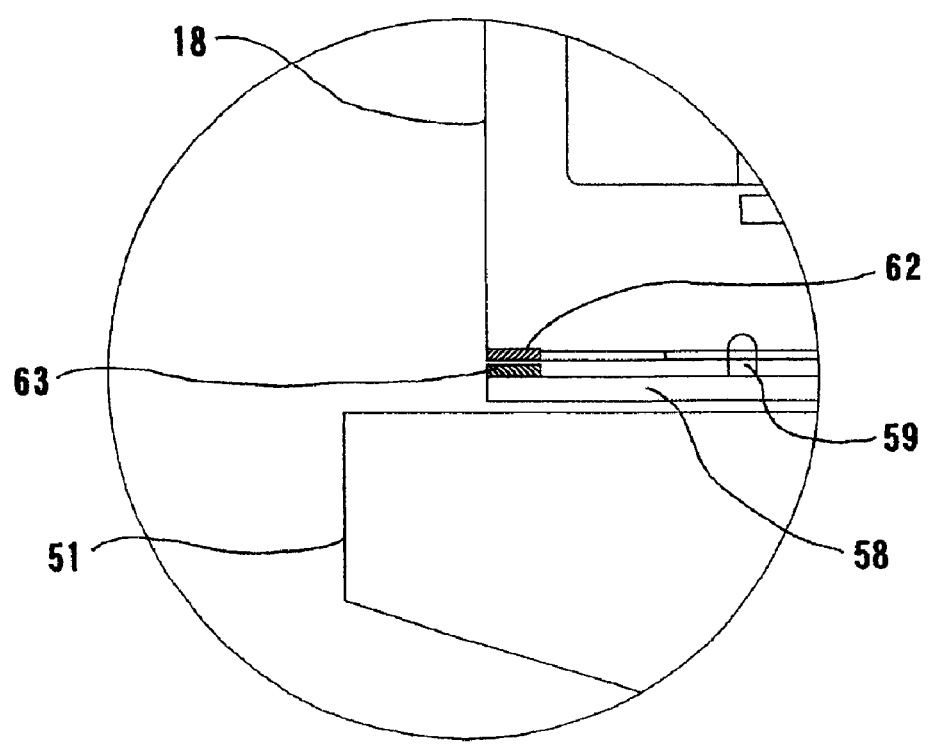
FIG. 22 is a side view to illustrate still another method of powering the substrate transport container.

FIG. 22 shows another method of charging. Although this method is non-contact and is similar to the one shown in FIG. 20, the power receiving terminal 62 is provided on the bottom section of the container 18. Here, it should be noted that the location of the power supply and receiving terminals or its structure is not limited to those shown above. For example, while the substrate transport container is being placed on and transported by the automated transport vehicle between the processing apparatuses, the air inside the substrate transport container is circulated by the power supplied from the battery or an external power source in the automated transport vehicle by operating the fan motor. Also, when the substrate transport container is placed on a processing apparatus and is in a standby state, power may be supplied from the battery or external power source in the processing apparatus. Such powering arrangements are applicable to the case of charging as well. Also, such powering apparatus does not only include charging devices for charging but also may include a load port having powering capability, temporary warehouse, semiconductor manufacturing apparatus, automated transport apparatus, manual transport apparatus, and performance testing apparatus.

Next, a movable power supply mechanism will be explained specifically with reference to FIGS. 23A, 23B through 26.

Figure 23A:
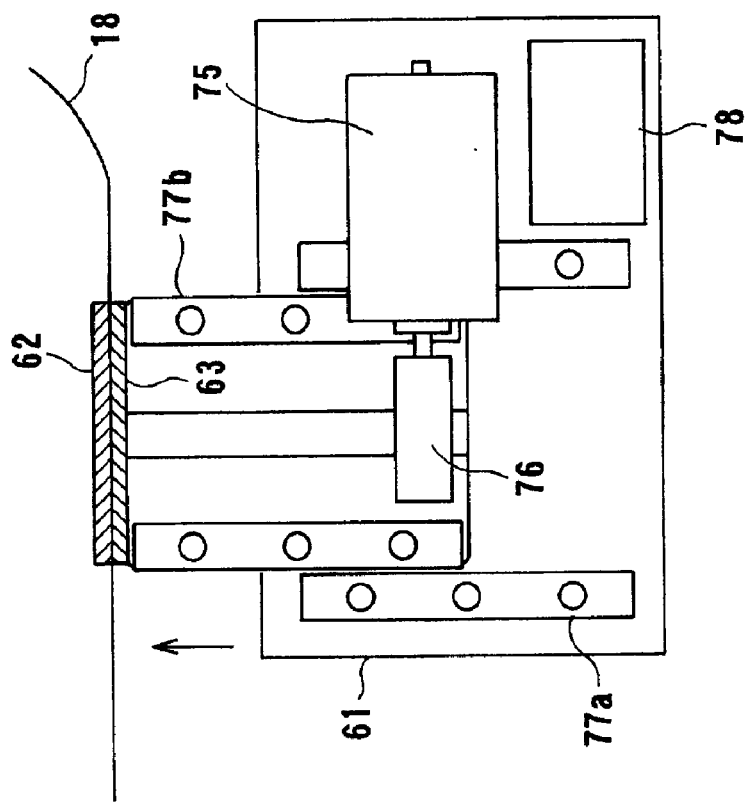
FIGS. 23A and 23B are diagrams to show a movable power supplying mechanism based on a motor, a gear and a linear slide-way.
Figure 23B:
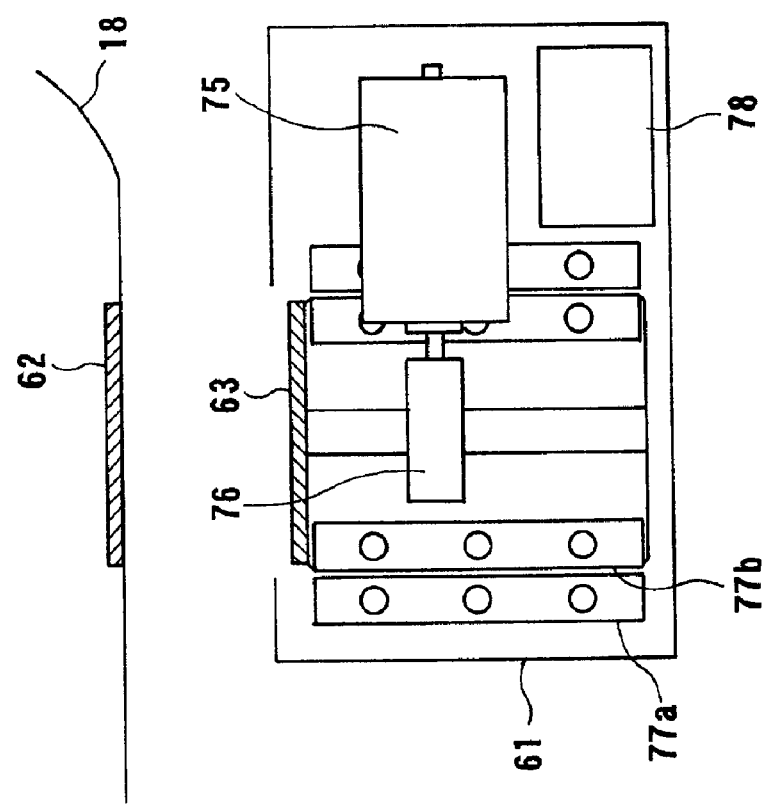

FIGS. 23A, 23B relate to movable power supply mechanisms based on a motor and gears and direct drive type slide-way. FIG. 23A shows a state of terminal retraction, and FIG. 23B shows a state of terminal extension for supplying the power. A substrate transport container 18 is placed above the power supply terminal section 61, and the power receive terminal 62 and the power supply terminal 63 are placed to face each other. During the terminal retraction state shown in FIG. 23A, the power supply terminal 63 is housed inside the power supply terminal section 61, but when the motor 75 is activated, the slide-way 77b on the movable side moves along the slide-way 77a of the fixed side by way of the gear 76, and the power supply terminal 63 contacts the power receive terminal 62 (refer to FIG. 23B). By so doing, power is supplied to the substrate transport container 18, and when powering is completed, the power supply terminal 63 is retracted inside the power supply terminal section 61 by the action of the rotating motor 75 so that the terminal would not protrude from the surface. The control board 78 is used to provide control for the power supply operation and to display the operational state.

FIGS. 24A, 24B show a direct drive type power supply mechanism based on a motor and a worm gear and a worm wheel. FIG. 24A shows a terminal retraction state and FIG. 24B shows a terminal extension state for supplying the power. As shown in FIG. 24A, the power supply terminal 63 is housed inside the terminal section 61. When the motor 75 is operated, worm gear 79a rotates resulting in rotation of the worm wheel 79b. The worm wheel 79b has a stopper 79c, and the rotation of worm wheel 79b causes the stopper 79c to move the movable platform 80a along the movable guide 80b, and the power supply terminal 63 contacts the power receive terminal 62 (refer to FIG. 24B). In this state, the the return spring 80c is being extended so that, when powering is completed, the terminal is returned, due to its spring action, to its original position, as shown in FIG. 24A.

Figure 26:
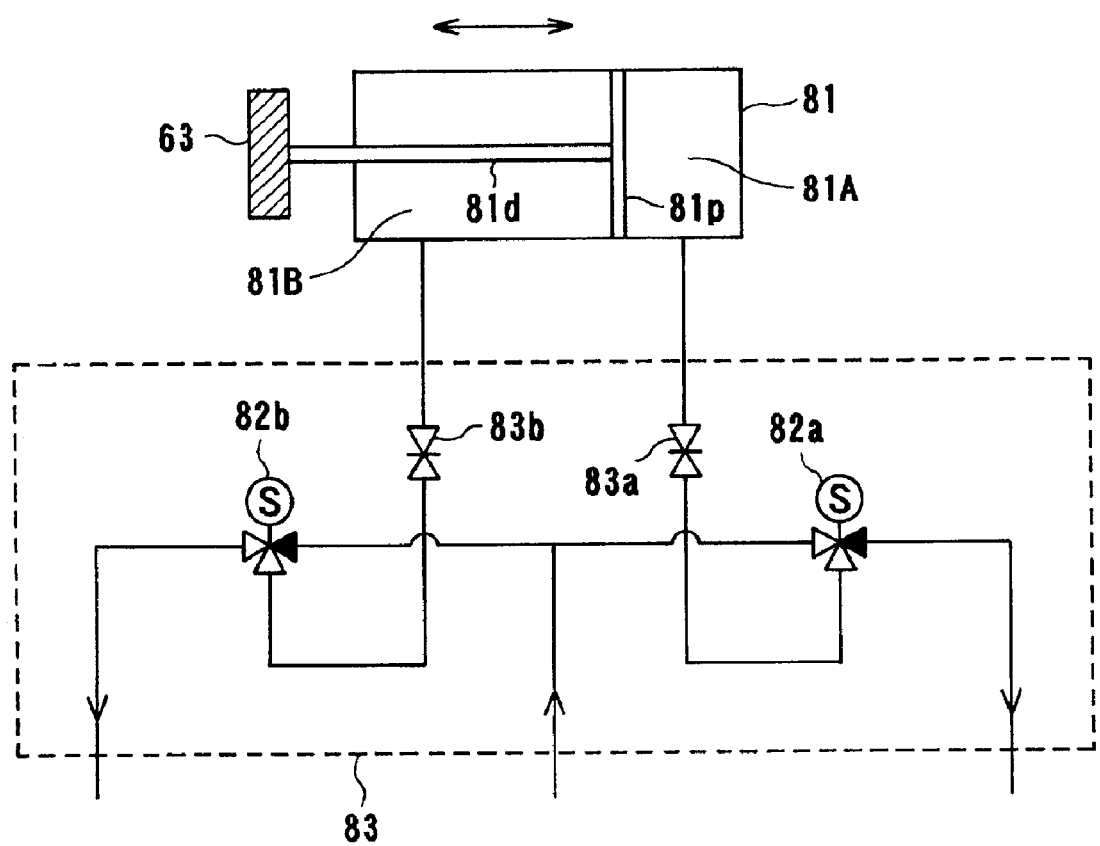
FIG. 26 is a diagram to show an air supply/exhaust mechanism of an air cylinder.

FIGS. 25A, 25B show a movable power supply mechanism based on a pneumatic drive. Power supply terminal section 61 is provided with an air cylinder 81 and air supply/exhaust tubes 82a, 82b, and the power supply terminal 63 is movable vertically. FIG. 25A shows the terminal retraction state and FIG. 25B shows the powering state. As shown in FIG. 26, the operation of the air cylinder 81 is such that, by having an air pressure provided inside the cylinder chamber 81A through the solenoid valve 82a and the needle valve 83a, the piston 81p is moved laterally, left or right in the diagram, to result in moving the power supply terminal 63 fixed to the rod 81d. At this time, the air inside the cylinder chamber 81B is exhausted through the needle valve 83b and the solenoid valve 82b. Conversely, when the air is introduced into the cylinder chamber 81B through the solenoid valve 82b and the needle valve 83b, the piston 81p moves laterally to the right in the diagram, to result in the movement of the power supply terminal 63 to the right. According to this method, a cylinder control unit 83 would be necessary.

In any of these methods, from the viewpoint of preventing terminal damage and reducing dust generation caused by sliding or contacts, it is better to adjust the average speed of moving the power supply terminal on the apparatus side in a range between 0.1 to 5 cm/s. Therefore, in any of these methods, because the power supply terminal can be retracted into the power supply terminal section (housing) 61 except during the powering stage, safe operation can be assured. Here, it is preferable that the surface of the power supply terminal be gold plated, gold plated on nickel bedding or rhodium plated to prevent metallic contamination of the cleanroom.

Further, when power supply is carried out from an external power source, it is preferable to commence supplying power after confirming that the substrate transport container is present and power is required to be supplied, or that the external power source connector and the power receiving terminal are connected together. This is because the apparatus is used inside the cleanroom. If sparks are generated between the electrical terminals, metallic micro-particles are generated and contaminate the cleanroom.

FIG. 27 shows a bottom view of the substrate transport container in the fourth embodiment of the present invention.

The basic construction of the substrate transport container is the same as that of the substrate transport container in the first embodiment shown in FIGS. 1 through 7. This substrate transport container is provided with an inlet port 90a and an outlet port 90b on the bottom surface so as to enable circulate of an inert gas inside the container. That is, the inlet port 90a and the outlet port 90b are connected, for example, to a purging port, to enable to gas-purging of the container using an inert gas (nitrogen gas, for example) or dried air. Check valves are provided in the inlet port and outlet port 90a, 90b, respectively, so that the gas is made to flow in one direction only, and not back stream. Further, depending on a specification, check valves may not be provided in the inlet port and outlet port, which is provided with a particulate removal filter or a combination of a particulate removal filter and a gas contaminant removal filter.

FIG. 28A shows the closed state of the check valve 95 by the spring action of the spring 97 provided in the inlet port 90a, so that gas does not flow from the exterior side 92 to the interior side 91 of the container. FIG. 28B shows the open state of the check valve 95, and in this case, the pressure on the exterior side 92 of the container is higher than that in the interior side 91 of the container, and the check valve 95 is opened against the spring force of the spring 97, so that the gas flows in the direction of the arrow in the diagram. This gas stream is supplied to the interior side 91 of the container through the particle removal filter 94.

FIG. 29A shows the closed state of the check valve of the outlet port 90b, and FIG. 29B shows the open state of the check valve. In the air outlet port 90b, when the pressure in the interior side 91 of the container becomes higher than a sum of the pressure in the exterior side 92 of the container and the spring force of the spring 97, the check valve 95 is opened against the force of the spring 97, resulting in opening of the check valve 95 to cause the gas to flow from the interior side 91 to the exterior side 92 of the container as shown by the arrow in the diagram. When the pressure in the interior side of the container is lower than the spring force of the spring 97, the check valve 95 is sealed off by the o-ring 96 provided in the receiving section of the container isolation wall 93 to prevent back streaming of gas from the exterior side to the interior side. Here, in this example, one inlet port and one outlet port are provided, but more than two ports may be provided. Also, they may be provided in surfaces other than the bottom surface.

When the interior of a highly hermetic container is replaced with a dry gas, that is, dried air or an inert gas having no moisture content, immediately after the replacement action, humidity drops roughly to a limiting humidity value at about 0%. However, if the container is left in this state by stopping the supply of dry gas, the moisture component held in the walls of the polymeric materials diffuses into the container interior due to a humidity gradient. Therefore, the humidity of the container interior replaced with the dry gas increases with passage of time. In one example, in the case of a container made of conventional commercial PC (polycarbonate), humidity at 0% existed immediately after replacement with a dry gas increases to a level higher than 30% after several hours. By using polyphenylene sulfide (PPS) of 0.02% moisture absorption factor, the effect of suppressing humidity rise was confirmed such that the relative humidity of 0% noted immediately after replacement with dry gas rose only to about 12% even after several hours, thereby confirming the effective prevention of an extreme rise in humidity. It is obvious that such a container would prevent the humidity in the interior of the container to rise during the transport process. Further, it is known that growth of natural oxide film is suppressed by storing in a dark place. For this reason, it is preferable that the material for making the container main body should be a shading material rather than a transparent material.

Also, the interior of the container is usually filled with air, but by using an inert gas with a controlled amount of oxygen, oxidation of copper can be prevented. The oxygen level in such a case should be less than 10000 ppm or preferably less than 1000 ppm.

Next, a process suitable for using the present substrate transport container will be presented.

Figure 30:
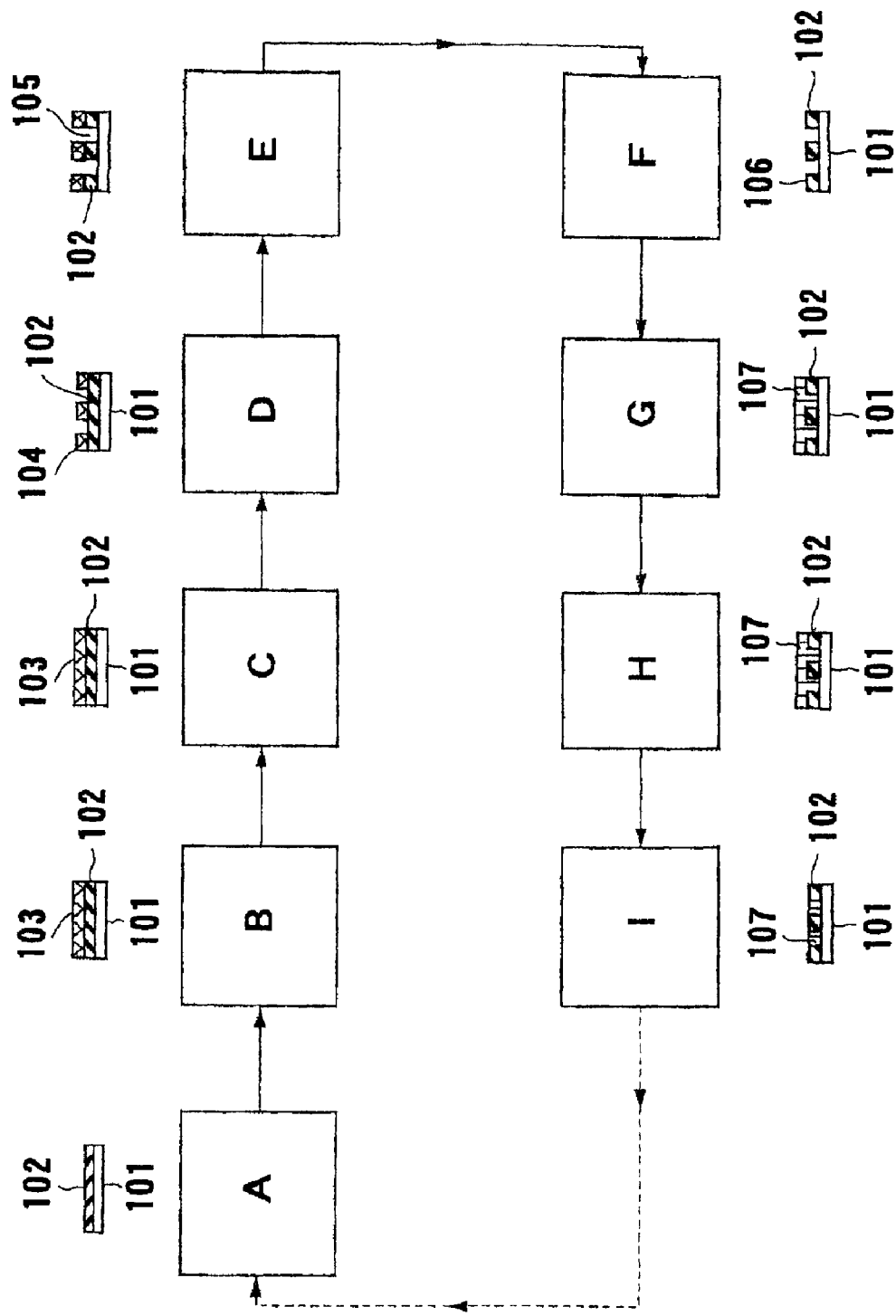
FIG. 30 is a diagram to show an example of a wiring circuit forming process for a semiconductor chip using copper wire and a low dielectric insulation film.

FIG. 30 shows an example of wiring formation process of a semiconductor chip based on copper wiring and low dielectric insulation film. As shown in FIG. 30, a CVD (chemical vapor deposition) apparatus or coater is used to deposit insulation film 102 comprising organic film or porous film on top of the conductive wiring layer of the semiconductor substrate 101 having device elements fabricated thereon (step A). Next, after forming the plug film and others as necessary, a photo-resist material 103 is applied using a coater, then the coated substrate is dried (step B). Next, after exposing the coated substrate using the stepper (step C), the resist film is developed to form a resist pattern 104 on the insulation film 102 (step D). Next, contact holes and wiring grooves 105 are formed on the insulation film 102 by etching (step E), and after removing the resist film 103, a barrier layer comprising TaN and the like is formed thereon, and on top of this layer, a copper seed layer 106 is formed to serve as the power input layer for electrolytic plating (step F).

Then, by applying a copper layer 107 on the surface of the semiconductor substrate 61, contact holes and grooves of the device substrate are filled with copper when the copper layer 67 is formed on top of the insulation layer 102 (step G). Then, the device substrate is annealed (step H) and, using chemical and mechanical polishing (CMP), a portion of the copper layer is removed from the top of the insulation layer so as to roughly level the surfaces of the copper layer 107 filling the contact holes and wiring grooves with the surface of the insulation layer (step I). This process is repeated as many times as the number of layers of wiring required to produce a multi-layered wiring structure comprised by 6–8 layers.

When the insulating layer of low dielectric constant is exposed to air, the absolute humidity in the air should be less than $4\times10^{-3}$ g/g (20% relative humidity at 25° C.), or more preferably less than $1\times10^{-3}$ g/g (5% relative humidity at 25° C.).

When the copper layer is exposed to air, the absolute humidity in the air should be less than $4\times10^{-3}$ g/g (20% relative humidity at 25° C.), or more preferably less than $1\times10^{-3}$ g/g (5% relative humidity at 25° C.). Further, the concentration of organic substances of boiling point higher than 80° C. should be less than 1 $\mu$g/m$^3$, more preferably less than 0.5 $\mu$g/m$^3$. The concentration of oxygen should be less than 10000 ppm, or more preferably less than 1000 ppm.

When the resist film is exposed to the air, the concentration of at least the basic gases should be less than 1 $\mu$g/m$^3$, more preferably less than 0.5 $\mu$g/m$^3$.

Also, if the humidity is low, static electricity is easily generated, and such static charges cause elements such as FET condensers to become vulnerable to destruction, so, that it is desirable to ground the semiconductor wafers. Methods of grounding include the use of conductive wafer carrier or the use of a metal terminal on the wafer carrier to ground individual wafers, or the wafer carrier itself may be made of an electrically conductive material.

Further, to manage wafer ID, history and status for each batch, each substrate transport container may be provided with a memory chip for the purpose of managing the process data.

Figure 31A:
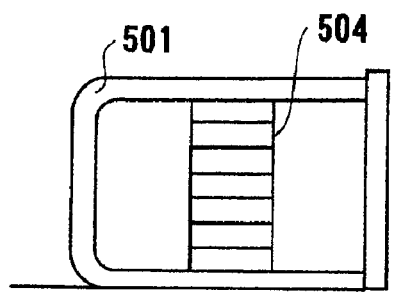
FIGS. 31A to 31H are diagrams to show various methods for discharging static electricity from the transport container.
Figure 31B:
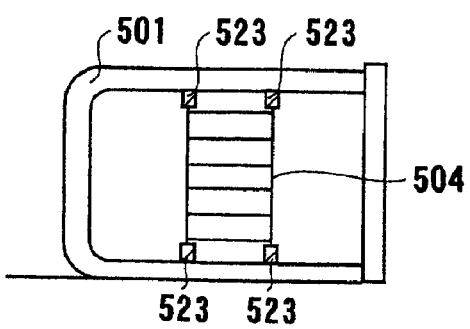
Figure 31C:
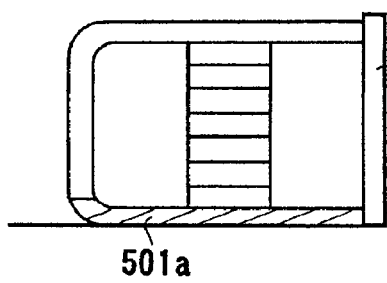
Figure 31D:
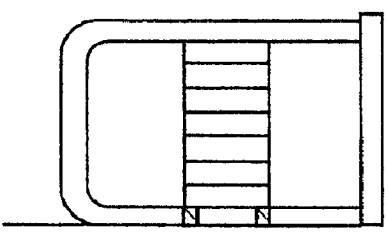

Next, various methods of discharging the static electricity from wafers stored inside the substrate transport container will be explained. As shown in FIG. 31A, discharging of static electricity from the wafers inside the container (pod) is carried out by grounding the holding section 504 that supports the wafers inside the container. When the holding section 504 is made as one unit with the container main body of the substrate transport container, the entire main body 501 including the holding section 504 should be made of an electrically conductive material. Also, when the holding section 504 and container main body 501 are made separately, as shown in FIG. 31B, the holding section 504 and the container main body 501 are made individually of electrically conductive materials, and a structure should be constructed such that these components are joined electrically with using an electrically conductive material 523. Further, as shown in FIG. 31C, only the bottom section 501a of the container main body 501 may be made of an electrically conductive material. Also, as shown in FIG. 31D, only the section 501b of the substrate transport container that is in contact with the holding section 504 may be made of an electrically conductive material.

Figure 31E:
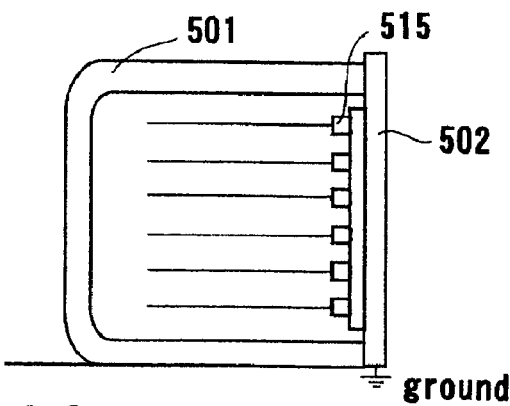
Figure 31F:
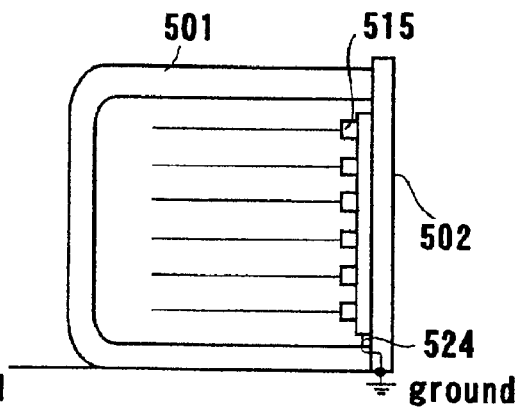

Other methods for discharging the static electricity from the substrate transport container include a method as shown in FIG. 31E. The fixation device 515 for pressing the substrates and preventing shifting of the substrates and the door 502 may be made of an electrically conductive material so as to discharge the electricity through the door to the ground of an apparatus where the container is placed. Also, as shown in FIG. 31F, only the fixation device 515 may be made of an electrically conductive material so that a grounding terminal 524 is connected with the fixation device 515 for grounding, thereby grounding the bottom section of the container to an external ground.

Figure 31G:
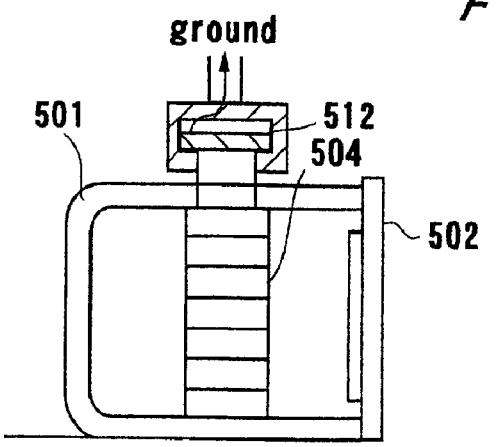
Figure 31H:
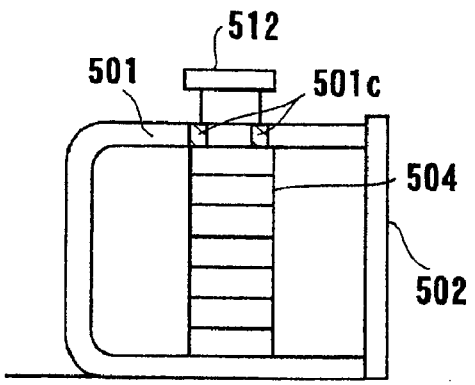

Still another method of grounding includes a method, as shown in FIG. 31G, to ground through the robotic handling flange 512 used for the OHT transport system. The holding section 504 and the flange 512, which is handled by robot and held by OHT, are made as one unit with using an electrically conductive material, and the charge on the wafers is grounded though the holding section 504 and flange 512 of the container to the ground portion of the OHT. Also, as shown in FIG. 31H, the flange 512 and the holding section 504 may be made as separate members and grounding is provided by electrically connecting through a part 501c of the container 501 made of an electrically conductive material. Further, only a part 501c of the container main body that contacts the holding section may be made of an electrically conductive material.

As explained above, this invention provides a substrate transport container and a method for its operation suitable for use in automated semiconductor manufacturing plants for integrated circuit production and the like. Therefore, transport and storage of semiconductor substrates can be carried out effectively. Also, the present invention provides a substrate transport container suitable for storing or transporting objects including not only semiconductor wafers, but also photo-masks or hard-disks, in a highly clean environment.

What is claimed is:

1. A substrate transport container having a door for loading and unloading substrates on a surface of a container main body and constructed so as to hold the substrates inside the container main body at a given distance of separation, wherein air conditioning apparatuses are disposed substantially symmetrically on a lateral surface of the container main body for reducing concentrations of particles and gaseous contaminants in interior of the container, wherein the container main body is provided with a cover for isolating an interior environment of the container main body from an external environment on both lateral surfaces of the container main body, and openings are provided on said lateral surfaces of the main body inside said cover to communicate with an interior space of the container main body so as to circulate air that has been adjusted in the air conditioning apparatus disposed inside the cover through the interior space of the container main body.

2. A substrate transport container according to claim 1, wherein a device is further provided for reducing and/or adjusting humidity in interior of the container.

3. A substrate transport container according to claim 1, wherein the container main body and a holding member for holding substrates are formed integrally as a unit body.

4. A substrate transport container according to claim 3, wherein the container main body and the holding member for holding substrates are comprised by static-charge conductive material or static-charge dispersing material.

5. A substrate transport container according to claim 1, wherein the container main body and a holding member for holding substrates are made as separate members.

6. A substrate transport container according to claim 1, wherein the container main body is made of a material having a water absorption factor of less than 0.1%.

7. A substrate transport container according to claim 2, wherein the device for adjusting humidity utilizes a solid polymer electrolytic film.

8. A substrate transport container according to claim 1, wherein the air conditioning apparatus is comprised by an air circulation device, a particle removal filter and a gaseous contaminants removal filter.

9. A substrate transport container according to claim 1, wherein the container main body is provided with a door in a front surface, a power source unit in a rear surface, and air conditioning apparatuses on both lateral surfaces.

10. A substrate transport container according to claim 1, wherein an opening is disposed on a front surface side and another opening is disposed on a rear surface side of the container main body.

11. A substrate transport container according to claim 9, wherein air is circulated by directing from an opening provided in a rear surface side through interior of container main body to an opening provided in a front surface side.

12. A substrate transport container according to claim 1, wherein the container main body is provided with a gas inlet port and a gas outlet port having a check valve in each port.

13. A substrate transport container comprising:
a container main body constructed so as to be able to hold substrates inside said container main body at a given distance of separation;
a door on said container main body for loading and unloading the substrates;
air conditioning apparatuses disposed on sides of said container main body for reducing concentrations of particles and gaseous contaminants inside of said container main body;
covers provided on said sides of said container main body isolating an interior environment of said container main body from an external environment, said air conditioning apparatuses being disposed inside said covers; and
openings on said sides of said container main body and inside said covers so as to communicate with the interior environment of said container main body so that air that has been conditioned by said air conditioning apparatuses can be circulated through the interior space of said container main body.

14. The substrate transport container of claim 13, and further comprising a device for reducing and/or adjusting humidity in the interior environment of said container main body.

15. The substrate transport container of claim 14, wherein said device for reducing and/or adjusting humidity in the interior environment of said container main body comprises a solid polymer electrolytic film.

16. The substrate transport container of claim 13, wherein said container main body comprises a holding member for holding substrates that is formed integrally with said container main body as a unit body.

17. The substrate transport container of claim 16, wherein said container main body and said holding member are comprised of a static-charge conductive material or a static-charge dispersing material.

18. The substrate transport container of claim 13, wherein said container main body comprises a holding member for holding substrates that is formed as a separate member from said container main body.

19. The substrate transport container of claim 13, wherein said container main body is made of a material that has a water absorption factor of less than 0.1%.

20. The substrate transport container of claim 13, wherein said air conditioning apparatuses each comprises an air circulation device, a particle removal filter and a gaseous contaminants filter.

21. The substrate transport container of claim 13, wherein said container main body has said door provided in a front surface of said container main body, a power source unit provided in a rear surface of said container main body and said air conditioning units provided substantially symmetrically on lateral surfaces of said container main body.

22. The substrate transport container of claim 21, wherein said air conditioning apparatuses are each provided to circulate air through the interior of said container main body through said openings by directing air from one of said openings provided at a rear part of said container main body, through the interior of said container main body and to another of said openings at a front part of said container main body.

23. The substrate transport container of claim 13, wherein said openings include an opening at a rear part of one of said sides of said container main body and another opening at a front part of one of said sides of said container main body.

24. The substrate transport container of claim 13, wherein said container main body has a gas inlet port and a gas outlet port each having a check valve.

25. A substrate transport container according to claim 1, wherein said air conditioning apparatuses are disposed substantially symmetrically inside of the covers on both lateral surfaces of the container main body.

26. A substrate transport container according to claim 1, wherein said air conditioning apparatuses reduce concentrations of particles and gaseous contaminants in interior of the container.

27. A substrate transport container according to claim 1, wherein a center of gravity of the container substantially coincides with a holding device disposed on an upper surface of the container main body so that the container can be handled in a stable manner.

28. A substrate transport container according to claim 1, wherein said openings are provided on said lateral surfaces of the main body inside said over to communicate with an interior space of the container main body so as to circulate air that has been adjusted in the air conditioning apparatus disposed inside the cover through the interior space of the container main body.

29. A substrate transport container according to claim 1, wherein a holding device is provided on said cover for use by an operator.

30. A substrate transport container according to claim 1, powering to said power source is carried out by electromagnetic induction in non-contact method.

31. A substrate transport container according to claim 13, wherein said air conditioning apparatuses are disposed substantially symmetrically inside of the covers on both lateral surfaces of the container main body.

32. A substrate transport container according to claim 13, wherein said air conditioning apparatus reduces concentrations of particles and gaseous contaminants in interior of the container.

33. A substrate transport container according to claim 13, wherein center of gravity of the container substantially coincides with the holding device disposed on the upper surface of the container main body so that the container can be handled in a stable manner.

34. A substrate transport container according to claim 13, wherein said openings are provided on said lateral surfaces of the main body inside said cover to communicate with an interior space of the container main body so as to circulate air that has been adjusted in the air conditioning apparatus disposed inside the cover through the interior space of the container main body.

35. A substrate transport container according to claim 13, wherein a second holding device is provided on said cover for use by an operator.

36. A substrate transport container according to claim 13, powering to said power source is carried out by electromagnetic induction in non-contact method.

* * * * *